United States Patent
Zhang et al.

(10) Patent No.: US 8,254,514 B1
(45) Date of Patent: Aug. 28, 2012

(54) EARLY-LATE GATE TIMING RECOVERY

(75) Inventors: Hongyuan Zhang, Sunnyvale, CA (US); Zhiyu Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 1299 days.

(21) Appl. No.: 11/951,725

(22) Filed: Dec. 6, 2007

Related U.S. Application Data

(60) Provisional application No. 60/882,061, filed on Dec. 27, 2006.

(51) Int. Cl.
*H04L 7/04* (2006.01)
(52) U.S. Cl. ........ 375/355; 375/148; 375/150; 375/354; 375/222; 375/316; 375/321; 375/219; 375/376; 375/141; 375/142; 375/149
(58) Field of Classification Search .............. 375/355, 375/148, 150, 354, 222, 316, 321, 219, 376, 375/141, 142, 149; 370/335, 342, 345, 474
See application file for complete search history.

(56) References Cited

U.S. PATENT DOCUMENTS

| | | | | |
|---|---|---|---|---|
| 4,599,701 A * | 7/1986 | Vojir et al. | | 708/605 |
| 6,760,364 B2 * | 7/2004 | Kohli et al. | | 375/150 |
| 7,295,601 B1 * | 11/2007 | Sinha et al. | | 375/222 |
| 7,333,532 B2 * | 2/2008 | Baltersee et al. | | 375/148 |
| 7,561,646 B2 * | 7/2009 | Steele et al. | | 375/347 |
| 7,750,976 B2 * | 7/2010 | Scott et al. | | 348/558 |
| 7,817,760 B2 * | 10/2010 | Black et al. | | 375/355 |
| 2004/0252668 A1 * | 12/2004 | Ozukturk et al. | | 370/335 |
| 2008/0075220 A1 * | 3/2008 | Honken et al. | | 375/376 |

OTHER PUBLICATIONS

"Part 11: Wireless LAN Medium Access Control (MAC) and Physical Layer (PHY) specifications: Higher-Speed Physical Layer Extension in the 2.4 GHz Band", The Institute of Electrical and Electronics Engineers, Inc., IEEE Std 802.1 1b-1999, pp. 1-89.

* cited by examiner

*Primary Examiner* — Dhaval Patel

(57) ABSTRACT

An early-late gate based ADC timing approach is described for performing early-late gate timing recovery despite the presence of multipath signal distortion. Multipath conditions may severely distort Barker correlator magnitudes generated for taps within two taps of a determined bit synchronization time. Exemplary embodiments of the described approach may combine Barker correlator magnitudes for several receive chains to calculate the timing error correction corresponding to a difference of early and late taps. The approach may be used to increase the size and stability of Barker correlator magnitudes generated for taps far away from a determined bit synchronization time. Such embodiments allow early-late differences to be generated using combined Barker correlator magnitudes generated at taps that are two or more chips from a determined bit synchronization time, thereby avoiding multipath distortion that may distort Barker correlator magnitudes generated within two or more chips from the determined bit synchronization time.

30 Claims, 12 Drawing Sheets

EARLY-LATE GATE TIMING RECOVERY

INCORPORATION BY REFERENCE

This application claims the benefit of U.S. Provisional Application No. 60/882,061, "802.11b Early-Late Gate Timing Recovery For Multiple Antenna Receivers," filed by Hongyuan Zhang and Zhiyu Yang on Dec. 27, 2006, which is incorporated in its entirety by reference herein.

BACKGROUND

Downconversion is the process by which a radio frequency (RF) signal is stripped of its high frequency carrier wave to reveal the information carrying waveform embedded within. Needless to say, downconversion processes are implemented within virtually every radio, cell phone, two-way transceiver, pager, transponder and other device that receives information propagated via an RF signal. Received RF signals are downconverted to a baseband signal that has a form and frequency that can be manipulated using electronic components so that the information contained within can be extracted and used.

In a direct-conversion system, a received RF signal may be downconverted to a baseband analog signal using a single downconversion stage. In a multi-stage conversion system, a received RF signal may be downconverted to a baseband analog signal using multiple downconversion stages. In such multi-stage conversion systems, a received RF signal may be downconverted in a first downconversion stage to an Intermediate Frequency (IF) signal having a frequency lower than that of the original RF signal. Subsequent downconversion stages may further downconvert the IF signal produced by a preceding downconversion stage until a baseband analog signal with desired frequency characteristics is achieved. Regardless of whether a direct-conversion system or a multi-stage conversion system is used to generate the baseband analog signal, the generated baseband analog signal may be sampled by an analog-to-digital converter (ADC) to produce a baseband digital signal.

Unfortunately, due to the inconsistency of the local clocks used by the respective transmitting and receiving devices, a timing offset may exist that may cause an analog-to-digital converter (ADC) in a receiving device to sample the generated baseband analog signal using a sampling timing that is out of phase with the incoming signal. Such a condition may be described as the sampling timing not being properly locked. If not corrected, such a timing offset may, on its own, result in an increase in errors in the generated baseband digital signal and an increased frame error rate in subsequently extracted data stream due to a reduced signal-to-noise ratio in the recovered signal.

FIG. 1, presents an exemplary early-late gate timing loop 100 that may be used within a device with a single antenna receiver to control the sampling timing of the analog-to-digital converter so that the sampling timing of the analog-to-digital converter is able to remain locked to the incoming signal. As shown in FIG. 1, early-late gate timing loop 100 may include an analog-to-digital converter 102, a digital low-pass filter 104, a digital decimator 106, a digital mixer 108, a Barker correlator 110, an early-late difference generator 112 and a loop filter 124.

For example, in operation, analog-to-digital converter 102 may receive a baseband analog signal and may sample the incoming baseband analog signal at 44 MHz, e.g., at four times the chip rate, to produce a 44 MSPS (Mega-Samples Per Second) stream of, for example, digitized 6-bit sample values. Digital low-pass filter 104 may receive the 44 MSPS stream of digitized 6-bit sample values and may apply a low-pass filtering algorithm to generate a low-pass filtered stream of digitized 6-bit sample values at 44 MSPS. Digital decimator 106 may receive the low-pass filtered stream of digitized 6-bit sample at 44 MSPS and may remove every second 6-bit sample, i.e., every other 6-bit sample, to produce a stream of digitized 6-bit samples at 22 MSPS. Digital mixer 108 may receive the stream of digitized 6-bit samples at 22 MSPS and may mix the 6-bit samples with a phasor of the form $e^{-j\theta}$, to produce a stream of complex baseband values at 22 MSPS. Barker correlator 110 may receive the stream of complex baseband values at 22 MSPS and may correlate the incoming stream of complex baseband values with the chosen Barker code to produce a stream of correlated complex values that may be received by early-late difference generator 112. Details related to operation of the Barker correlator 110 are addressed in greater detail below.

Early-late difference generator 112 may include a switch 114 that may be selectively closed to pass a correlated complex value output from Barker correlator 110 to magnitude generator 116 at a time that is one-half chip prior to a determined bit synchronization time, or bit_sync_time. Magnitude generator 116 may generate a magnitude of the received correlated complex value. This magnitude value may be referred to as an early magnitude. Further, early-late difference generator 112 may include a switch 118 that may be selectively closed to pass a correlated complex value output from Barker correlator 110 to magnitude generator 120 at a time that is one-half chip after the determined bit_sync_time. Magnitude generator 120 may generate a magnitude of the received correlated complex value. This magnitude value may be referred to as a late magnitude. Magnitude generator 116 and magnitude generator 120 may calculate a magnitude for a received correlated complex number, such as x, using the equation, $$\text{Magnitude}(x) = \sqrt{(Re\{x\})^2 + (Im\{x\})^2} \qquad \text{EQ. 1}$$

where $Re\{x\}$ is the real, or Inphase, portion of the correlated complex value output by the Barker correlator; and where $Im\{x\}$ is the Imaginary, or Quadrature, portion of the correlated complex value output by the Barker correlator.

Early-late difference generator 112 may further include an adder 122 that may receive the early-magnitude from magnitude generator 116, receive the late-magnitude from magnitude generator 120, and subtract the generated early-magnitude from the generated late-magnitude, or vice versa, to generate a magnitude difference that may be passed to loop filter 124. Loop filter 124 may process the received magnitude difference and may generate a timing control signal that may be passed to analog-to-digital controller 102 to advance or retard the sampling timing used by analog-to-digital controller 102 to sample the analog IF signal.

For example, as shown in FIG. 1, the magnitude difference generated by difference generator 112 may be provided to a loop filter 124 that, based on the sign and magnitude of the determined difference, may generate a control signal that may be used to advance or retard sample times used by analog-to-digital converter 102. With each iteration of the loop, the loop filter may generate an adjustment to the sampling timing performed by analog-to-digital converter 102 that may change the sampling time of the analog-to-digital converter 102 so the early and late Barker correlator magnitudes are nearly equal. Assuming the slope of the Barker correlator magnitude curve, e.g., as shown in FIG. 2 at 202, is symmetrical about the peak magnitude at bit_sync_time, the difference value produced by difference generator 112 should approach zero as the analog-to-digital converter sampling approaches, i.e., locks onto, the chip rate, or frequency/phase of the baseband analog signal. The closer the lock of the analog-to-digital sampling timing, the greater the correlation between the complex digital baseband signal and the Barker code. This may result in an increased Barker correlator output magnitude at bit_sync_time.

Although not explicitly addressed above, exemplary early-late gate timing loop 100 is a circuit within a receiver device that includes additional circuits that support other functions performed by the receiver. For example, in support of exemplary early-late gate timing loop 100, the receiver device may include either a direct-conversion system or a multi-stage conversion system, as described above, that receives and downconverts an RF signal to the baseband analog signal sampled by analog-to-digital controller 102. Further, the receiver device may include a receiver controller that controls the integrated operation of respective circuits based on, for example, a state machine and/or control parameters that may be used to control and monitor processing performed by the respective circuits. For example, the receive controller may monitor the output of Barker correlator 110 and may determine and store a bit_sync_time that corresponds to a tap at which the greatest correlation between the received stream of complex baseband samples and the Barker code was achieved in prior Barker correlation cycles. Alternatively, the bit_sync_time may be determined using another processing technique using other circuitry supported by the receiver device. In either case, the controller may use its knowledge of the determined bit_sync_time to control the opening and closing of switch 114 and switch 118 within difference generator 112, i.e., ½-chip prior to the determined bit_sync_time and ½-chip after the determined bit_sync_time, respectively, as described above.

In the circuit described above with respect to FIG. 1, it is assumed that the transmitting device encodes a 1 Mbps data stream into the transmitted signal using an 11-bit Barker code. Use of an 11-bit Barker code by the transmitting device means that each symbol, e.g., a binary 0 or binary 1, has been multiplied, or spectrally spread, by the 11-bit Barker code to be represented in the transmitted signal by 11 sub-symbol intervals, referred to as chips. Accordingly, Barker correlator 110 within the receiver device may use the same 11-bit Barker code to recover or de-spread the encoded values. However, as described above with respect to FIG. 1, the stream of complex baseband values enters Barker correlator 110 at 22 MSPS. Such a sample rate represents a represents a 2× oversampling of the chip rate.

Barker correlator 110 may accommodate such oversampling by duplicating each chip in the original 11-bit Barker code. For example, an 11-bit Barker code such as "+1 +1 +1 −1 −1 −1 +1 −1 −1 +1 −1" may be represented within the Barker correlator as "+1 +1 +1 +1 +1 +1 −1 −1 −1 −1 −1 −1 +1 +1 −1 −1 −1 −1 +1 +1 −1 −1," and used to generate a Barker code magnitude output for each of the 22 half-chip intervals.

FIG. 2 is a plot 202 of exemplary magnitude values, each magnitude generated for each correlated complex baseband sample generated by the exemplary Barker correlator within the circuit presented in FIG. 1. FIG. 2 presents a magnitude for each of 22 half-chip intervals. As represented in FIG. 2, each tap index, labeled 1 through 22, represents a half-chip increment. Therefore, the early-magnitude, indicated in FIG. 2 at tap index 11 and labeled 206, and the late-magnitude, indicated in FIG. 2 at tap index 13 and labeled 208 are each ½-chip from the bit_sync_time, indicated in FIG. 2 at tap index 12 and labeled 204. Therefore, the magnitude values at tap index 11 and at tap index 13, correspond, for example, to exemplary correlated complex baseband samples that may be passed by switch 114 and switch 118 into magnitude generators 116 and 120, respectively, for use in generating the early-late difference value produced by adder 122 and passed to loop filter 124, as described above with respect to FIG. 1.

SUMMARY

Unfortunately, the performance of a receiver that implements the above-described early-late gate based ADC timing approach is optimal primarily in the presence of additive white Gaussian noise (AWGN). However, other types of distortion, such as multipath signal distortion, intermittent interference by other transmitters, and/or other sources of physical signal distortion may significantly affect the ability of such timing loop filters to obtain an accurate lock on a received signal, thereby forcing a received signal to be processed without fully correcting the above-described sampling timing offset. Therefore, such distortion may result in a receiver device achieving lower signal-to-noise ratios, resulting in higher frame error rate.

For example, multipath distortion may be caused by reflections of a transmitted signal off of objects surrounding the receiver device. As a result of multipath signal distortion, in some locations, a receiver may receive multiple distorted versions of the original transmitted signal in addition to a direct path version of the original transmitted signal, while in other locations, a receiver may not even receive a direct path signal, but may only receive multiple distorted versions of the original transmitted signal.

Receipt of such a multipath combination of signals may make it difficult for a receiver using the early-late gate based timing approach, described above with respect to FIG. 1, to keep the analog-to-digital (ADC) converter in phase with the received baseband analog signal. For example, assuming a single signal is received, a Barker correlator produces its greatest output magnitude at a bit_sync_time corresponding to the highest correlation between the received signal and the Barker code. However, in the case of signals that contain multipath signal components, each multipath signal component may suffer from time delays, fading and other distortions, due to differences in the distance traveled by the respective components and/or the shapes and types of materials from which the respective components were reflected or were forced to pass though en route to the receiver. When combined together and processed as a single signal, a plurality of multipath signals may significantly affect the shape of the magnitude curve produced from the Barker correlator output. This multipath distortion is clearly evident about the theoretical bit_sync_time of the undistorted original signal, because the bit_sync_time is the time at which each signal contributed its greatest energy to the Barker correlator output, as addressed above. Such distortions to the Barker correlator output may affect the early-late magnitude difference values generated about a determined bit_sync_time, resulting in inaccurate offset corrections to the sampling timing of analog-to-digital converter 102, thereby limiting the ability of analog-to-digital converter 102 to obtain an accurate lock on the received baseband analog signal. Under severe multipath conditions, such distortion may even result in the selection of an incorrect bit_sync_time. Further, because the distortions affecting the respective multipath signals may change over time, peaks in correlation magnitudes produced by Barker correlator 110 may also wander over time, hence the difference values produced by difference generator 112 may also wander over time as reflection paths between the signal transmitter and the signal receiver fluctuate. In addition, disruptions to signal reception due to multipath distortion may be exacerbated, for example, in mobile receivers in which the multiple reflection paths between the signal transmitter and the signal receiver are constantly changing.

Hence, a need exists for an early-late gate based ADC timing approach with improved performance in multipath signal environments. Embodiments of the approach would be compatible with existing direct-sequence spread spectrum (DSSS) techniques and compatible with popular transmission protocols such as, for example, IEEE 802.11b. Further, embodiments of the approach would be able to integrate input received from multiple-receivers in order to obtain improved performance in multipath environments.

The early-late gate timing recovery approach described below provides improved performance in multipath environments, is compatible with existing direct-sequence spread spectrum (DSSS) techniques and is compatible with popular transmission protocols such as, for example, IEEE 802.11b. Further, embodiments of the approach are able to receive and process baseband analog signals downconverted from RF signals received via one or more receiver circuits.

A first exemplary embodiment of the described early-late gate timing recovery approach may include an early-late difference generator capable of receiving correlated complex values output in parallel from one or more Barker correlators. The Barker correlators may each be configured to receive and process complex baseband samples generated from separate IF signals. The separate IF signals may be downconverted from RF signals received by separate RF receivers.

A second exemplary embodiment of the described early-late gate timing recovery approach may include an early-late difference generator that further includes a plurality of magnitude generators, each configured to generate and store a magnitude value based on a correlated complex baseband sample received from a Barker correlator. The generated magnitude may be estimated from each received correlated complex baseband sample, such as x, using the equation, $$\text{Magnitude}(x) = \text{Max}((Re\{x\}),(Im\{x\})) \times 13/32 (\text{Min}((Re\{x\}),(Im\{x\}))) \quad \text{EQN. 2}$$

where Re{x} is the real, or Inphase portion of the correlated complex value output by the Barker correlator; where Im{x} is the Imaginary, or Quadrature portion of the correlated complex value output by the Barker correlator; where the function Max( ) returns the larger of the values received; and where the function Min( ) returns the smaller of the values received.

In a third exemplary embodiment, the described early-late gate timing recovery approach may include an early-late difference generator that further includes an adder that combines the output of two or more magnitude generators to produce a combined magnitude value. For example, each magnitude may be generated from a correlated complex value output by a Barker correlator processing complex baseband samples associated with separate receivers. Therefore, the combined magnitude value may a combined magnitude based on the output of two or more receivers.

In a fourth exemplary embodiment of the described early-late gate timing recovery approach, a combined magnitude from two or more receivers may be generated for a selected early-tap and a combined magnitude from two or more receivers may be generated for a selected late-tap. For example, the selected early-tap may be separated in sequence from the selected late-tap by 1 chip. The early-late difference generator may further include an adder that generates a difference between the early-tap combined magnitude and the late-tap combined magnitude to produce an early-late difference that may be output from early-late difference generator for further processing.

In a fifth exemplary embodiment of the described early-late gate timing recovery approach may include an early-late control gate that may selectively pass an early-late difference produced by early-late difference generator to a timing loop filter that may generate an analog-to-digital converter phase correction control signal. An exemplary early-late control gate may be statically and/or dynamically configured to selectively pass an early-late difference produced by the early-late difference generator relative to a determined bit_sync_time. For example, the early-late control gate may be statically, or dynamically, configured to pass to a timing loop filter for processing, the early-late difference generated a specified number of chips after an identified bit_sync tap or a specified number of chips prior to the next occurrence of the identified bit_sync tap.

A sixth exemplary embodiment of the described early-late gate timing recovery approach may include a timing control apparatus for generating a sampling timing correction for an analog-to-digital converter. The apparatus can include a means for receiving a correlated complex baseband sample from one or more correlators for a current tap, a means for generating a magnitude for each received correlated complex baseband sample, a means for generating a combined magnitude based on the magnitudes generated for the current tap, a means for receiving and storing the combined magnitude generated for the current tap; a means for retrieving a combined magnitude generated at a prior tap, a means for generating a combined magnitude difference based on the combined magnitude generated at the current tap and the combined magnitude generated at the prior tap, and a means for generating a sampling timing correction based on the generated combined magnitude difference.

In a seventh exemplary embodiment of the described early-late gate timing recovery approach the above described sixth embodiment of a timing control apparatus for generating a sampling timing correction for an analog-to-digital converter may further include one or more of a means for receiving, in parallel, a plurality of complex baseband samples originating from separate receivers, a means for separating the current tap and the prior tap from a bit synchronization time by at least two chips, a means for allowing the chip separation between the current tap and the prior tap from the bit synchronization time to be dynamically configurable, a means for monitoring a performance parameter associated with recovery of a data stream encoded within the received complex baseband samples, and a means for adjusting a chip delay that controls a separation of the current tap and the prior tap from the bit synchronization time based on the monitored performance parameter.

As addressed above, in a strongly delay-dispersive channel, i.e., a channel that is significantly affected by multipath distortion, the Barker correlator output around bit_sync_time, e.g., ½-chip before and ½-chip after bit_sync_time, may be noisy due to the effects of multipath distortion. This distortion may result in inaccurate early-late differences, i.e., a calculated difference between an early-tap magnitude calculated at a tap just prior to, e.g., ½ chip prior to, the bit_sync_time and a late-tap magnitude calculated at a tap just after, e.g., ½ chip after, the bit_sync time.

By allowing early-late differences to be generated based on Barker correlator output magnitudes generated for taps far away, e.g., two or more chips away, from the bit_sync_time, inaccuracies due to strong multipath distortion about the bit_sync_time may be avoided. Further, by allowing taps at which the early-late differences are generated to be dynamically configured, the exact tap location may be varied until a tap location is found that supports as strong a phase lock as possible on the received signal considering the presence of multipath conditions. For example, the selected tap locations used to generate early-late gate errors may be varied until the signal Frame Error Rate (FER) is below threshold considered to be acceptable, or a signal-to-noise ratio is above a threshold considered to be acceptable.

By using multiple receivers, a receiver device may significantly increase the strength of a received signal. Such receivers may have antennas that are co-located, or may have antennas that are separated by some significant distance, e.g. by the length of a vehicle such as a car, truck, airplane or ship, or installed at varied locations. By receiving and processing Barker correlator output from multiple receivers and combining their respective outputs, the described early-late gate timing recovery approach may reduce the effects of multipath distortion on the generated early-late gate error.

As addressed in the background section, prior early-late gate timing recovery approaches generate Barker correlator magnitudes based the square-root of the sum of the squares of the Inphase and Quadrature components of the correlated complex value output by the Barker correlator, as addressed above with respect to equation 1. Such calculations are processor intensive and time consuming. By generating correlator magnitudes based on the scaled product of minimum and maximum values, as described above with respect to equation 2, the described early-late gate timing recovery approach avoids such processor intensive and time consuming operations.

By combining magnitude values based on the output of a plurality of Barker correlators, each of the plurality of Barker correlators processing complex baseband samples that are received by the Barker correlators from multiple separate receivers operating in parallel, the described early-late gate timing recovery approach is able to increase the magnitude and stability of Barker correlator magnitudes generated for taps far away, e.g., two or more chips away from the bit_sync_time. Such higher, more stable correlator magnitudes allow the described early-late gate timing recovery approach to provide more accurate early-late errors at taps far from the bit_sync_tap.

BRIEF DESCRIPTION OF THE DRAWINGS

Exemplary embodiments of an early-late gate timing recovery approach that are compatible with communication techniques such as, for example, direct sequence spread spectrum (DSSS) and IEEE 802.11b, and that may be used in systems including one or more receivers, will be described with reference to the following drawings, wherein like numerals designate like elements, and wherein.

DETAILED DESCRIPTION OF EMBODIMENTS

Figure 3:
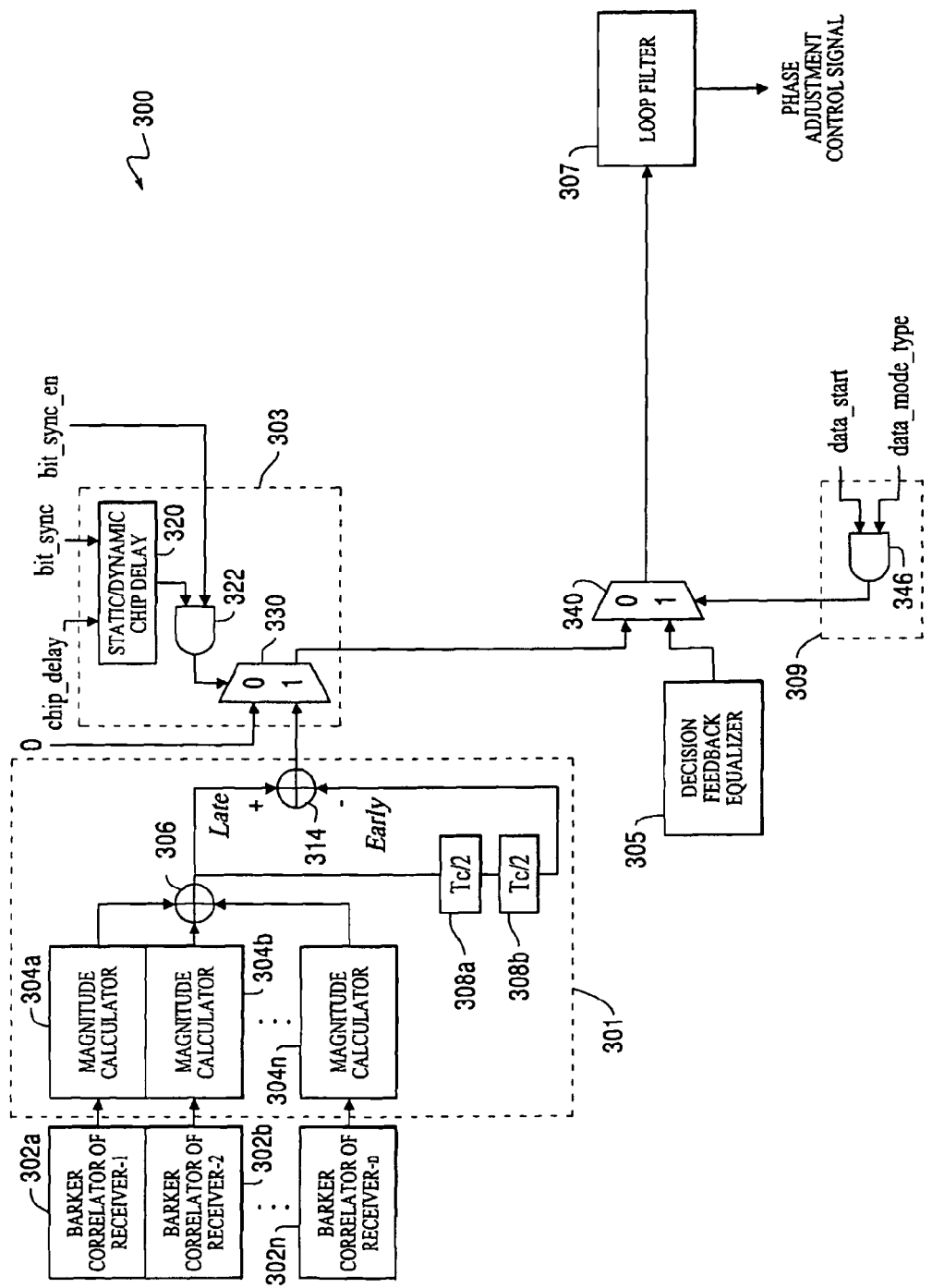
FIG. 3 is a schematic diagram of an exemplary early-late gate based ADC timing circuit that may be used with multiple receiver systems in the presence of multipath signal distortion in addition to AWGN.

FIG. 3 is a schematic diagram of an exemplary embodiment of an early-late gate based analog-to-digital converter (ADC) timing circuit 300 that may be used in, for example, an IEEE 802.11b compliant receiver device with multiple receivers. Early-late gate based ADC timing circuit 300 may be used to generate early-late gate based timing corrections, or phase adjustments, despite the presence of multipath signal distortion and other signal distortion.

As shown in FIG. 3, early-late gate based ADC timing circuit 300 may include a multi-receiver early-late difference generator 301, an early-late gate controller 303, a decision feedback equalizer circuit 305, a loop filter 307, and a mode selection controller 309.

Multi-receiver early-late difference generator 301 may receive, for example, a 22 MSPS stream of correlated complex baseband samples from one or more Barker correlators, in parallel, and may process the respective parallel streams to generate a stream of early-late combined magnitude difference scalar values at a rate of 22 MSPS. For example, multi-receiver early-late difference generator 301 may include one or more magnitude calculators, each magnitude calculator may be configured to receive a 22 MSPS stream of correlated complex baseband samples from one Barker correlator and may output a single scalar magnitude value for each correlated complex baseband sample received, as described in greater detail, below, with respect to FIG. 4.

In FIG. 3, an exemplary multi-receiver early-late difference generator 301 is shown that may include multiple magnitude calculators. For example, the exemplary multi-receiver early-late difference generator 301 is shown to include at least three magnitude calculators, labeled 304a, 304b and 304n, respectively. Each of the three magnitude calculators may be configured to receive a 22 MSPS stream of correlated complex baseband samples from one of three corresponding Barker correlators, labeled 302a, 302b and 302n, respectively. The scalar value output generated by each magnitude calculator in response to each received correlated complex value may be passed to an adder 306 that may generate a combined magnitude that is a sum of the three scalar magnitudes generated by each of magnitude calculator 304a, magnitude calculator 304b and magnitude calculator 304n.

The combined magnitude produced by adder 306 may be passed to early-late difference generator 314 as a combined late-magnitude. The combined magnitude produced by adder 306 may also be passed to a first delay register 308a that may hold the combined magnitude for a predetermined period of time, e.g., Tc/2, or ½-chip, or 1-tap, as described below, before passing the stored combined magnitude to a second delay register 308b that may hold the combined magnitude for a second predetermined period of time, e.g., Tc/2, or ½-chip, or 1-tap, as described below, before passing the stored combined magnitude to early-late difference generator 314 as a combined early-magnitude. Early-late difference generator 314 may subtract a received early-magnitude from a received late-magnitude, or vice-versa, to produce a combined magnitude early-late difference that may be an output of multi-receiver early-late difference generator 301.

The exemplary multi-receiver early-late difference generator 301, described above, may receive a plurality of correlated complex baseband samples at an input rate of 22 MSPS and may generate a single stream of scalar values, i.e., a stream of combined magnitude early-late differences, at a rate of 22 MSPS. During operation, early-late difference generator 314 may receive, as the late-magnitude, a combined magnitude generated for correlated complex baseband samples delayed by two taps relative to the correlated complex values used to generate the early-magnitude. As described above, assuming the Barker correlators are configured to use an 11-bit Barker code, and the received signal contains a 1 MHz embedded data signal, the 22MSPS stream processed by multi-receiver early-late difference generator 301 can oversample the baseband signal by two-fold. Therefore, a Barker correlator chip can spread across two taps, and consequentially, each tap represents a ½-chip interval. Therefore, the delay introduced by first delay register 308a, i.e., ½-chip, and the delay introduced by second delay register 308b, i.e., ½-chip sum to a 1-chip delay. Therefore, early-late difference generator 314 generates a difference between a combined magnitude and a combined magnitude generated from a complex baseband signal 1-chip earlier.

Although the exemplary early-late gate based ADC timing circuit shown in FIG. 3 includes only three Barker correlators, any number of Barker correlators may be included so that a Barker correlator is provide for each receiver, 1 to N, where N is any integer. Further, although the exemplary early-late gate based ADC timing circuit shown in FIG. 3 includes only three magnitude calculators, any number of magnitude calculators may be included so that a magnitude calculator is provided to process the correlated complex values streams output by each Barker correlator, 1 to N, where N is any integer value. In addition, although the exemplary early-late gate based ADC timing circuit shown in FIG. 3 includes only two ½-chip delay registers, any number of such delay registers may be used to achieve a desired chip separation between the respective early-magnitude and late-magnitude values provided to early-late difference generator 314.

As described above, early-late gate based ADC timing circuit 300 may include an early-late gate controller 303. Early-late gate controller 303 may selectively pass a combined magnitude difference generated by multi-receiver early-late difference generator 301 to loop filter 307.

As shown in FIG. 3, an exemplary early-late gate controller 303 may include a static, or dynamically configurable, chip delay register 320, an AND gate 322, and a multiplexor 330. A first input signal lead to multiplexor 330 may be connected to a signal source that may provide a constant signal with a scalar value of zero, a second input signal lead to multiplexor 330 may be connected to the output of multi-receiver early-late difference generator 301 that may provide a signal representing a combined early-late magnitude difference, as described above. A control lead to multiplexor 330 may be connected to an output of AND gate 322, and an output of multiplexor 330 may be connected to a first input of a multiplexor 340 that controls input to loop filter 307, as described in greater detail below. A first input to AND gate 322 may be connected to a NOT(bit_sync_enabled) signal source that outputs a HIGH value during all taps, except the tap that corresponds to a determined bit_sync_time, and a second input to AND gate 322 may be connected to an output of static/dynamic chip delay register 320. An input to chip delay register 320 may be connected to a bit_sync signal source that outputs a HIGH value during a tap that corresponds to a determined bit_sync_time.

During operation of early-late gate based ADC timing circuit 300, multiplexor 330 may selectively pass either the zero scalar value received on the first input signal lead of multiplexor 330, or the scalar early-late magnitude difference received on the second input lead of multiplexor 330, to the output lead of multiplexor 330 connected to a first input of multiplexor 340 that controls input to loop filter 307. As indicated in FIG. 3, if the control signal received from AND gate 322 is LOW, the zero scalar value received on the first input signal lead of multiplexor 330 is passed to the output lead of multiplexor 330. If the control signal received from AND gate 322 is HIGH, the scalar early-late magnitude difference received on the second input lead of multiplexor 330 is passed to the output lead of multiplexor 330.

The output of AND gate 322 is HIGH when both the output of chip delay register 320 is HIGH and the NOT(bit_sync_enabled) signal is HIGH. The NOT(bit_sync_enabled) signal may be HIGH during all taps except during the tap designated as the bit_sync_tap. As shown in FIG. 3, chip delay register 320 may be configured to delay a received bit_sync input for any number of chips, or ½-chips, each ½-chip being the equivalent of 1 tap. Assuming chip delay register 320 is configured via signal chip_delay to delay each received bit_sync signal for 7 chips, since the bit_sync signal is HIGH during the bit_sync_time tap, only, the output of chip delay register 320 may be HIGH for one tap that is 7-chips, or 14 taps, away from the bit_sync tap. Based on such an exemplary configuration, early-late gate controller 303, may forward on the output lead of multiplexor 330, the scalar early-late magnitude difference generated by multi-receiver early-late difference generator 301 during a tap that is 7-chips away from the currently selected bit_sync_time, but may forward a scalar zero on the output lead of multiplexor 330 during all other taps.

Figure 5:
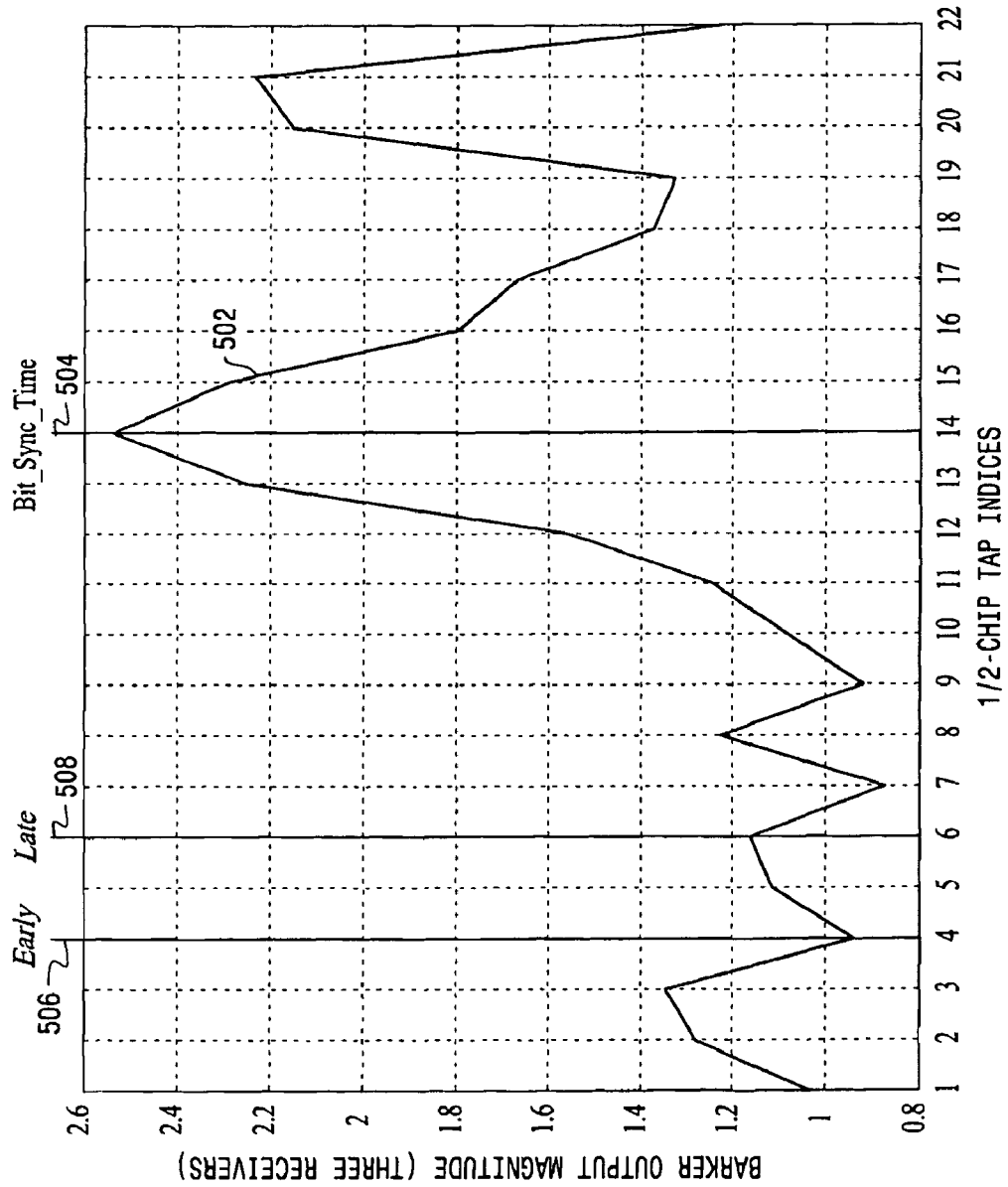
FIG. 5 is a plot of combined magnitude values generated based on input from multiple exemplary Barker correlators within the circuit presented in FIG. 3.

An example of the timing relationships for such a configuration is shown in FIG. 5. FIG. 5 is a plot of combined magnitude values generated based on input from multiple exemplary Barker correlators within the circuit presented in FIG. 3. As shown in FIG. 5, assuming that the current bit_sync_time corresponds to tap 14, configuring chip delay register 320 for a delay of 7-chips would result in a delay of 14-taps. This would result in a HIGH signal on the control lead of multiplexor 330 at tap 6 of the next Barker correlator period, which would result in a scalar early-late magnitude difference generated by multi-receiver early-late difference generator 301 that is the difference between the early-magnitude generated at tap 4 and the late-magnitude generated at tap 6, i.e., a early-late difference centered on tap 5, which is 4.5-chips prior to the currently selected bit_sync_time at tap 14.

Figure 1:
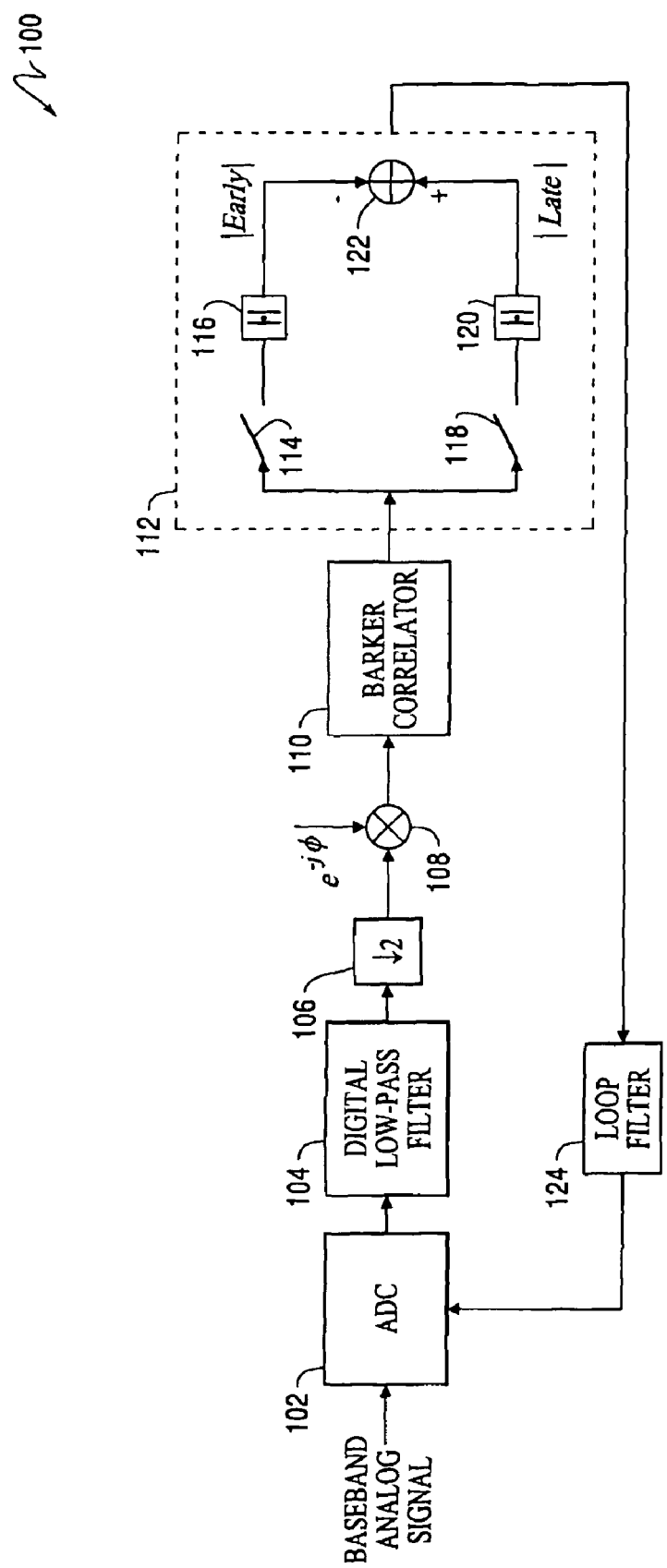
FIG. 1 is a schematic diagram of an exemplary early-late gate based ADC timing circuit for use with single receiver systems in the presence of AWGN.
Figure 2:
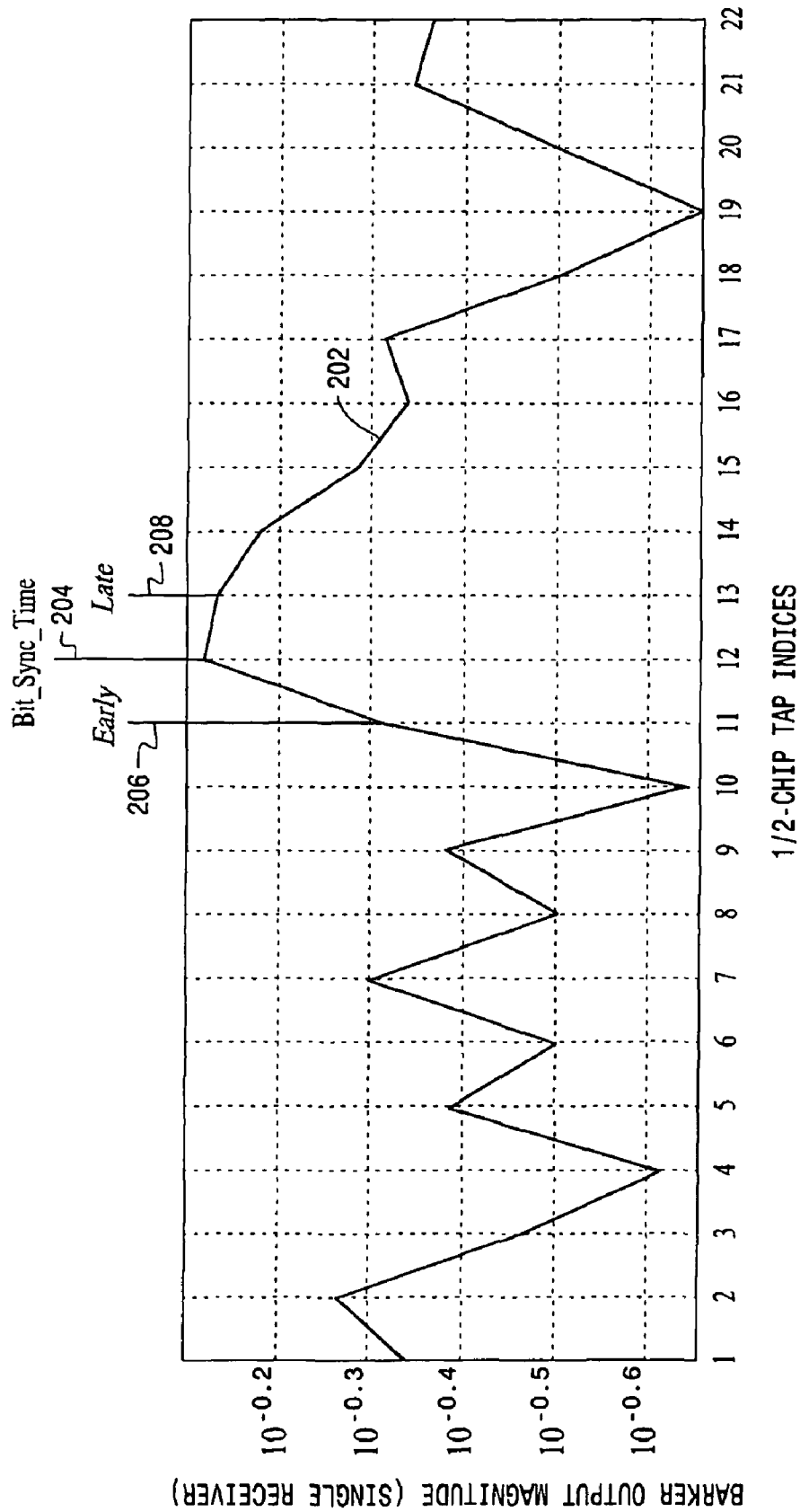
FIG. 2 is a plot of the magnitude values generated from the output of an exemplary Barker correlator within the circuit presented in FIG. 1.

By combining correlated complex baseband samples generated by a Barker correlators for a plurality of receivers, multi-receiver early-late difference generator 301 may increase the resulting Barker correlator combined magnitude values, as shown in FIG. 5, as compared to the Barker correlator magnitude values typically achieved with input from a single receiver, as shown in FIG. 2.

As described above, in a strongly delay-dispersive channel, Barker correlator output around bit_sync_time, e.g., ½-chip before and ½-chip after bit_sync_time, is noisy due to the effects of multipath distortion. This distortion results in inaccurate early-late gate error, i.e., a calculated difference between an early-tap magnitude calculated at a tap just prior to, e.g., ½ chip prior to, the bit_sync_time and a late-tap magnitude calculated at a tap just after, e.g., ½ chip after, the bit_sync_time.

The described early-late gate timing recovery approach may increase the size and the stability of Barker correlator magnitudes generated for taps far away, i.e., sufficiently separated for a signal to autodecorrelate, e.g., two or more chips away from the bit_sync_time. By allowing early-late gate differences to be generated based on Barker correlator output magnitudes generated for taps far away from the bit_sync_time, inaccuracies due to strong multipath distortion about the bit_sync_time may be avoided.

Further, in exemplary embodiments, the number of chip delays assigned to chip delay register 320 in early-late gate controller 303 may be dynamically configurable, thereby allowing early-late gate differences to be generated based on taps any number of taps away from the bit_sync_time, and on either side of the bit_sync_time. For example, assuming the bit_sync_time remains at tap 14, by setting the chip delay in chip delay register 320 to 3-chips, rather that the exemplary 7-chips depicted in FIG. 5, an early-late gate difference may be generated based on Barker correlator combined magnitudes generated for tap 18 and tap 20, respectively.

Due to the relatively unpredictable and often dynamically changing distortion caused by multipath interference, exemplary embodiments of the early-late gate based ADC timing circuit 300 may by dynamically configured to locate taps that may be used to generate combined magnitude differences, as described above, that result in accurate phase lock corrections.

For example, early-late gate based ADC timing circuit 300, described above, may be included within a receiver device that includes a wide range of other circuits. Each of these other circuits may perform functions that allow the receiving device to better receive and/or process an RF signal and to reliably decode and deliver a data stream embedded within the RF signal to a data sink. Such other functions may be performed by modules implemented in hardware, firmware and/or software using general-purpose and/or special purpose hardware such as an Application Specific Integrated Circuit (ASIC), a Field Programmable Gate Array (FPGA), a Digital Signal Processor (DSP), a multipurpose microprocessor, or similar devices.

Such a receiver device may include a controller that maintains, for example, static and dynamic control parameters and storage registers that may be used to control and coordinate the actions performed by the respective functions performed by modules within the receiver device. For example, although individual function modules may operate independently, the controller may determine when execution of such functions is initiated, may provide the respective functions with static and/or dynamic control parameters that direct the operation of the respective functions, and may receive and store interim and/or final results from the respective functions and may use such interim and/or final results to control and/or adjust operation of one or more other functions.

For example, with respect to early-late gate based ADC timing circuit 300, described above, a controller may include a circuit or function that monitors, for example, uncorrelated complex baseband samples from a downconverter, correlated complex baseband samples generated by the Barker correlator, a data stream output from a demodulator and/or a descrambler, and/or high level processes that use and/or assess the extracted data stream to determine quality monitoring control parameters, such as functions that determine a signal-to-noise ratio based on the correlated complex baseband samples generated by the Barker correlators and/or frame error rates in the extracted data stream. By generating and monitoring such quality control parameters, a controller may assess the performance of early-late gate based ADC timing circuit 300 and may make changes to control parameters that affect operation of early-late gate based ADC timing circuit 300, and/or other functions/modules to improve performance.

For example, with respect to operation of multi-receiver early-late difference generator 301 and early-late gate controller 303, described above, such a controller may assess the effectiveness of the early-to-late difference generator based on a set of separately generated signal-to-noise ratios and frame error rates. For example, assuming that chip delay register 320 may be dynamically configured with different chip delays, if a generated frame error rate exceeds a predetermined threshold, or if a generated signal-to-noise ratio falls below a predetermined threshold, the controller may adjust the chip delay provided to chip delay register 320, thereby shifting the taps based on which the combined magnitude early-to-late differences are generated.

For example, a controller may select an initial chip delay based on past acceptable performance. If, during operation, the monitored frame error rate increases to unacceptable levels, and/or the signal-to-noise ratio falls below an acceptable level, the controller may adjust the chip delay register 320, for example, by ½-chip increments until a stable portion of the combined magnitude curve is located that supports a sufficiently low frame error rate and/or a sufficiently high signal-to-noise ratio. If, after stepping through the entire available Barker correlator tap range, e.g., 22 taps, sufficient performance has not been achieved, the controller may chose not to use the early-late timing loop at all, but may select another ADC timing control loop in an effort to improve performance of the receive device under the currently existing distortion conditions.

For example, early-late gate based ADC timing circuit 300 may be one of several available timing loop approaches supported by a receiver device, and a controller within the receiver device may selectively choose which timing loop to use. In exemplary embodiments, a receiver device controller may select one of the several available timing loops based on, for example, the startup status of the receiver device, the degree to which a lock on a received RF signal has been achieved, and/or static and/or dynamically changing signal distortion conditions. Further, once a timing loop has been selected, a receiver device controller may adjust parameters within a selected timing loop in order to obtain and maintain as strong a lock as possible on a received signal using the selected timing loop. If, despite adjustments, a timing loop is unable to achieve a satisfactory lock, the receiver device may select a different timing loop. In addition, a controller may select a first timing loop to achieve a first lock on a received signal, but once the selected timing loop has achieve an initial lock, the controller may initiate a second timing loop that may be used to achieve a more accurate lock. Such second timing loop may be initialized with information obtained by the controller based on operations performed by the first timing loop.

Returning now to FIG. 3, as described above, early-late gate based ADC timing circuit 300 may include a mode selection controller 309 that may control whether loop filter 307 generates a phase adjustment control signal based on a scalar difference value generated by multi-receiver early-late difference generator 301 or based on a scalar difference value generated by decision feedback equalizer circuit 305.

As shown in FIG. 3, mode selection controller 309 may include an AND gate 346. A first input to AND gate 346 may be connected to a Data_Start signal source that may generate a HIGH value whenever early-late gate based ADC timing circuit 300 is selected to process data, and a second input to AND gate 346 may be connected to a Data_Mode_Type signal source that may generate a HIGH value whenever the controller has configured early-late gate based ADC timing circuit 300 to operate, for example, in Complimentary Code Keying (CCK) mode. CCK mode is used, for example, in the IEEE 802.11b X37 mode that supports a 5.5 Mbps encoded data stream in a received RF signal and also used in the IEEE 802.11b X6 mode that supports a 11.0 Mbps encoded data stream in a received RF signal. The output of AND gate 346 may be connected to the control lead of a multiplexor 340 that controls the source of input provided to loop filter 307.

In operation, the output of AND gate 346 may be HIGH when the Data_Start signal is HIGH, i.e., when the controller has selected early-late gate based ADC timing circuit 300 to process data, and when Data_Mode_Type is HIGH, i.e., when the controller has selected Complimentary Code Keying mode. As shown in FIG. 3, when the output of AND gate 346 is HIGH, the control lead of multiplexor 340 is HIGH, and therefore multiplexor 340 passes to its output signal lead the signal received on its HIGH input lead. When the output of AND gate 346 is LOW, the control lead of multiplexor 340 is LOW, and multiplexor 340 therefore passes to its output signal lead the signal received on its LOW input lead.

Therefore, as shown in FIG. 3, when the output of AND gate 346 is HIGH, multiplexor 340 is configured to accept the scalar output of decision feedback equalizer 305 for processing by loop filter 307. As further shown in FIG. 3, when the output of AND gate 346 is LOW, multiplexor 340 is configured to accept the scalar output of multi-receiver early-late difference generator 301 for processing by loop filter 307. Regardless of which mode is selected, loop filter 307 may generate a phase adjustment control signal that may be considered the generated final output of early-late gate based ADC timing circuit 300.

Figure 4:
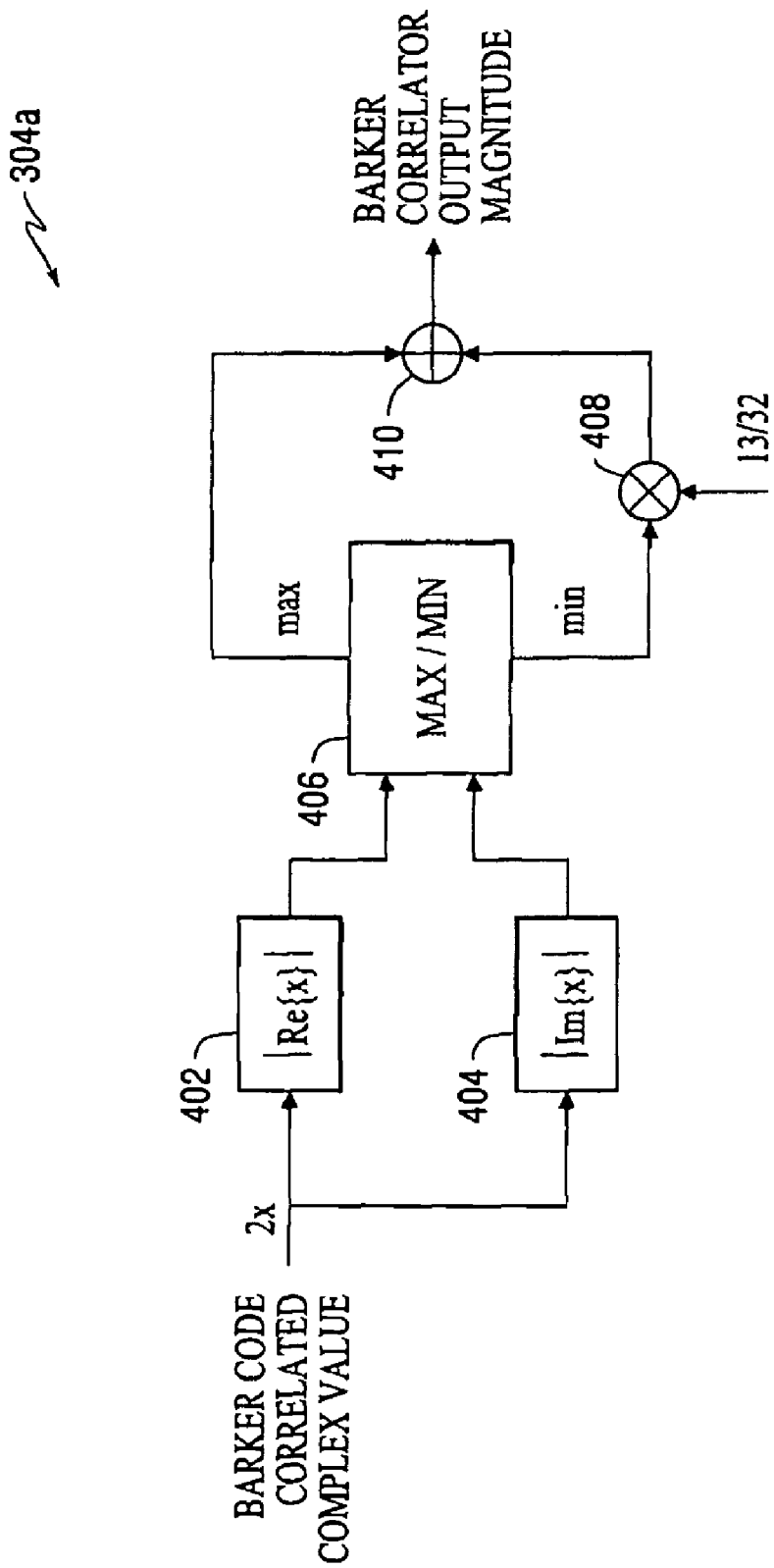
FIG. 4 is a schematic diagram of circuitry that generates a magnitude for the output of a Barker correlator within the early-late gate based ADC timing circuit presented in FIG. 3.

FIG. 4 is a schematic diagram of an exemplary circuit that may generate a magnitude for the output of a Barker correlator within the early-late gate based ADC timing circuit presented in FIG. 3. The circuit shown in FIG. 4 may receive a correlated complex baseband sample generated by a single Barker correlator that processes a stream of complex baseband digital signal associated with a single RF receiver, e.g., as shown in FIG. 3 at 302a, and may output a scalar magnitude based on a relationship described above with respect to equation 2.

Specifically, a magnitude calculator, e.g., as shown in FIG. 3 at 304a, may include real-component, or inphase-component, splitter 402, an imaginary-component, or quadrature-component, splitter 404, a Maximum/Minimum comparator 406, a mixer 408 and an adder 410. In operation, the exemplary magnitude calculator may receive a correlated complex baseband value at a rate of, for example, 22 MSPS, which may represent a 2× oversampling of the embedded data. Real-component splitter 402 may extract a real, or inphase, component scalar magnitude from the received correlated complex value. Imaginary-component splitter 402 may extract an imaginary, or quadrature, component scalar magnitude from the received correlated complex value. Maximum/minimum comparator 406 may compare the real-component scalar magnitude with the imaginary-component scalar magnitude and identify which is larger. The larger of the respective scalar components may be passed to adder 410 as a first input. The smaller of the respective scalar components may be passed to mixer 408, where the smaller scalar component is multiplied by a static, and/or dynamically configurable coefficient, e.g., 13/32 as shown in FIG. 4, and the output of mixer 408 may be passed to adder 410 as a second input. Adder 410 may add the larger of the scalar components generated by maximum/minimum comparator 406 with the scaled smaller scalar component generated by mixer 408 to produce a single, scalar, Barker correlator output magnitude. As described above with respect to FIG. 3, the Barker correlator output magnitude generated by a magnitude calculator may be combined by adder 306 to produce a combined magnitude which may be further processed by multi-receiver early-late difference generator 301.

Figure 6:
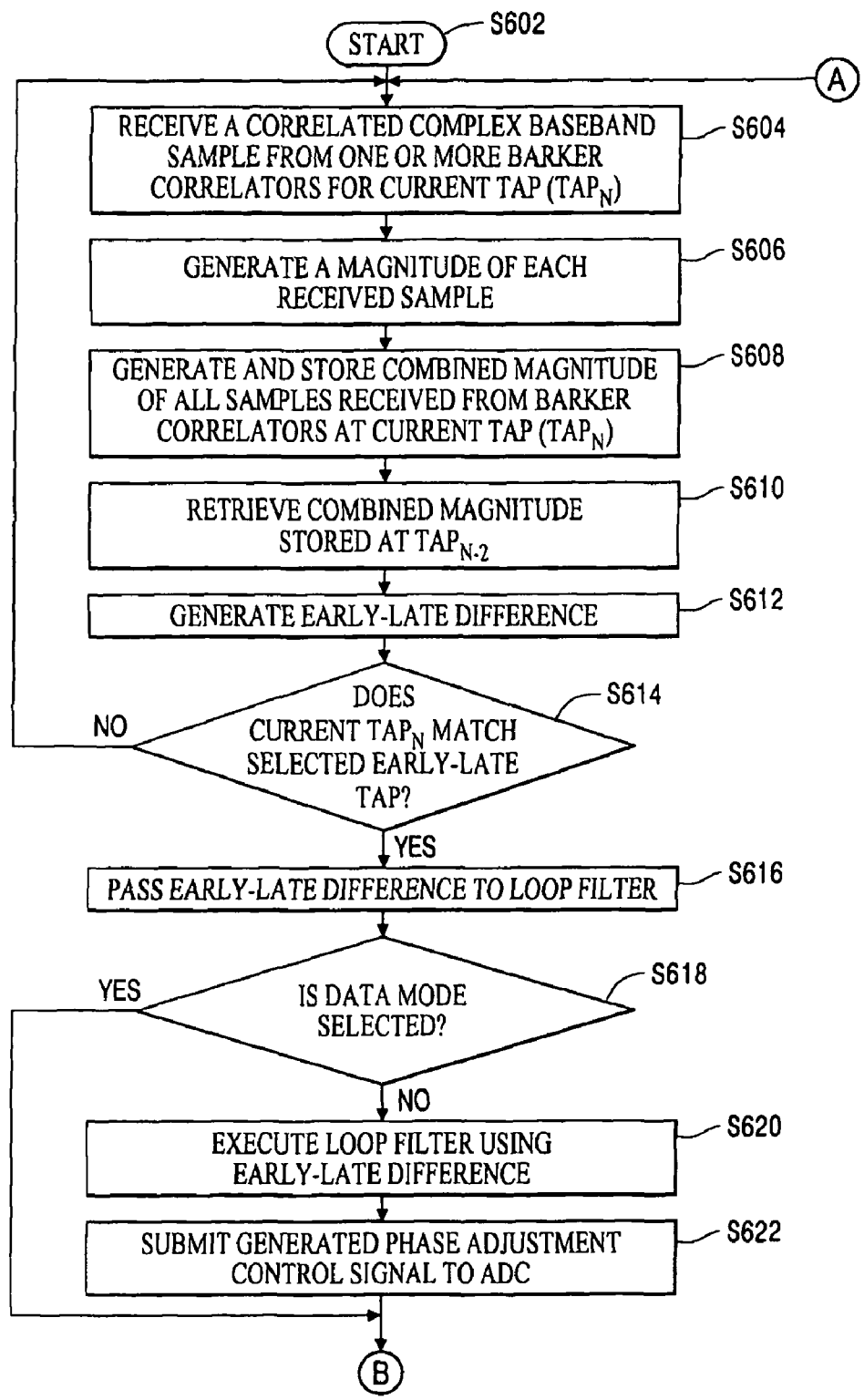
FIG. 6 and FIG. 7 are flow diagrams of an exemplary process executed by a receiver using the early-late gate based ADC timing circuit presented in FIG. 3.
Figure 7:
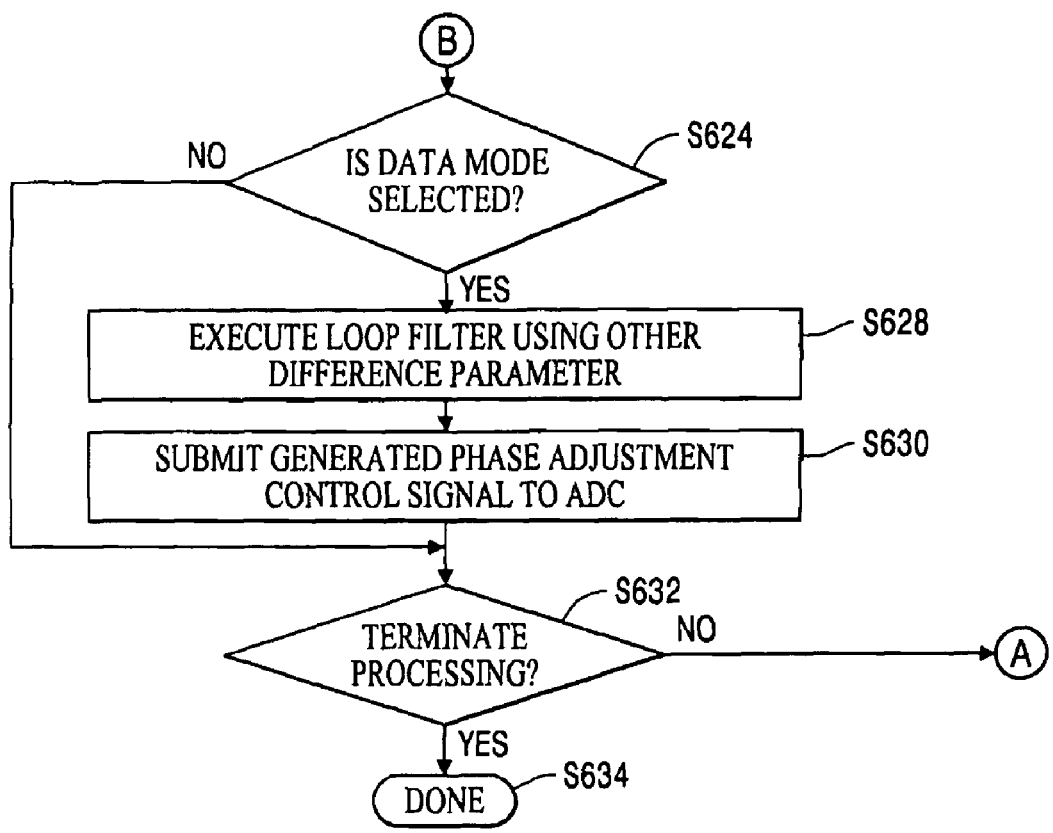

FIG. 6 and FIG. 7 are a flow diagram of an exemplary process executed by a receiver device using the exemplary early-late gate based ADC timing circuit presented in FIG. 3. The process flow presented in FIG. 6 and FIG. 7 assumes that the early-late timing loop has been executing for a plurality of taps and that the early-late gate based ADC timing circuit has generated and stored a combined magnitude for at least two taps prior to the current tap. In the process flow presented below, the tap for which the process is executing is referred to as $tap_N$, the previous tap is referred to as $tap_{N-1}$, the tap prior to $tap_{N-1}$ is referred to as $tap_{N-2}$, etc.

As shown in FIG. 6, operation of the process may begin at step S602 with selection of the early-late timing loop by a receiver device controller to perform ADC sampling phase corrections, and processing proceeds to step S604.

In step S604, multi-receiver early-late difference generator 301 may receive, via one or more magnitude calculators, a correlated complex baseband sample from one or more Barker correlators for a $tap_N$ and processing proceeds to step S606.

In step S606, the one or more magnitude calculators may each generate a magnitude for each received correlated complex baseband sample and processing proceeds to step S608.

In step S608, adder 306 may receive the respective generated Barker correlator magnitudes and may generate and store a combined Barker correlator magnitude that represents a combined magnitude of all samples received from Barker correlators at the $tap_N$ and processing proceeds to step S610.

In step S610, multi-receiver early-late difference generator 301 may retrieve a combined magnitude generated and stored two taps earlier, i.e., at $tap_{N-2}$, and processing proceeds to step S612.

In step S612, multi-receiver early-late difference generator 301, via, for example, adder 314, may generate an early-late combined magnitude difference that is a difference between the combined magnitude generated and stored in step S608 during $tap_N$ and the combined magnitude generated and stored in step S608 for $tap_{N-2}$, and processing proceeds to step S614.

If, in step S614, early-late gate controller 303, via, for example, AND gate 322, determines that the current tap corresponds with a predetermined chip_delay from the current bit_sync_time, as described above with respect to FIG. 3 and FIG. 5, processing proceeds to step S616, otherwise, processing returns to step S604.

In step S616, mode selection controller 309 may, via, for example, AND gate 322 and multiplexor 330, pass the early-late combined magnitude difference to multiplexor 340, and processing proceeds to step S618.

If, in step S618, mode selection controller 309, via, for example, AND gate 346, determines that a data mode, e.g., IEEE 802.11b X37 mode or X6E mode, has not been selected, as described above with respect to FIG. 3, processing proceeds to step S620, otherwise, processing proceeds to step S624.

In step S620, loop filter 307 may execute, for example, a proportional-integral loop that generates a timing or phase adjustment control signal using the early-late combined magnitude difference generated by multi-receiver early-late difference generator 301 and received via multiplexor 340, and processing proceeds to step S622.

In step S622, the phase adjustment control signal produced by loop filter 307 using the early-late combined magnitude difference generated by multi-receiver early-late difference generator 301, as described above with respect to FIG. 3, may be passed to the receiver device's analog-to-digital converter, and processing proceeds to step S624.

If, in step S624, mode selection controller 309, via, for example, AND gate 346, determines that a data mode, e.g., IEEE 802.11b X37 mode or X6E mode, has been selected, as described above with respect to FIG. 3, processing proceeds to step S626, otherwise, processing proceeds to step S632.

In step S628, loop filter 307 may execute, for example, a proportional-integral loop that generates a timing or phase adjustment control signal using an alternate metric, e.g., a difference metric other than the early-late combined magnitude value generated by multi-receiver early-late difference generator 301. For example, loop filter 307 may be executed using an output generated, for example, by decision feedback equalizer (DFE) 305 and received via multiplexor 340, as described above with respect to FIG. 3, and processing proceeds to step S630.

In step S630, a phase adjustment control signal produced by loop filter 307 using the alternate metric may be passed to the receiver device's analog-to-digital converter, and processing proceeds to step S632.

If, in step S632, early-late gate based ADC timing circuit 300 is no longer selected by receiver device controller for the generation of phase adjustments, or, for example, if the receiver device receives an instruction to shut down, processing proceeds to step S634 and processing terminates, otherwise, processing proceeds to S604.

Figure 8:
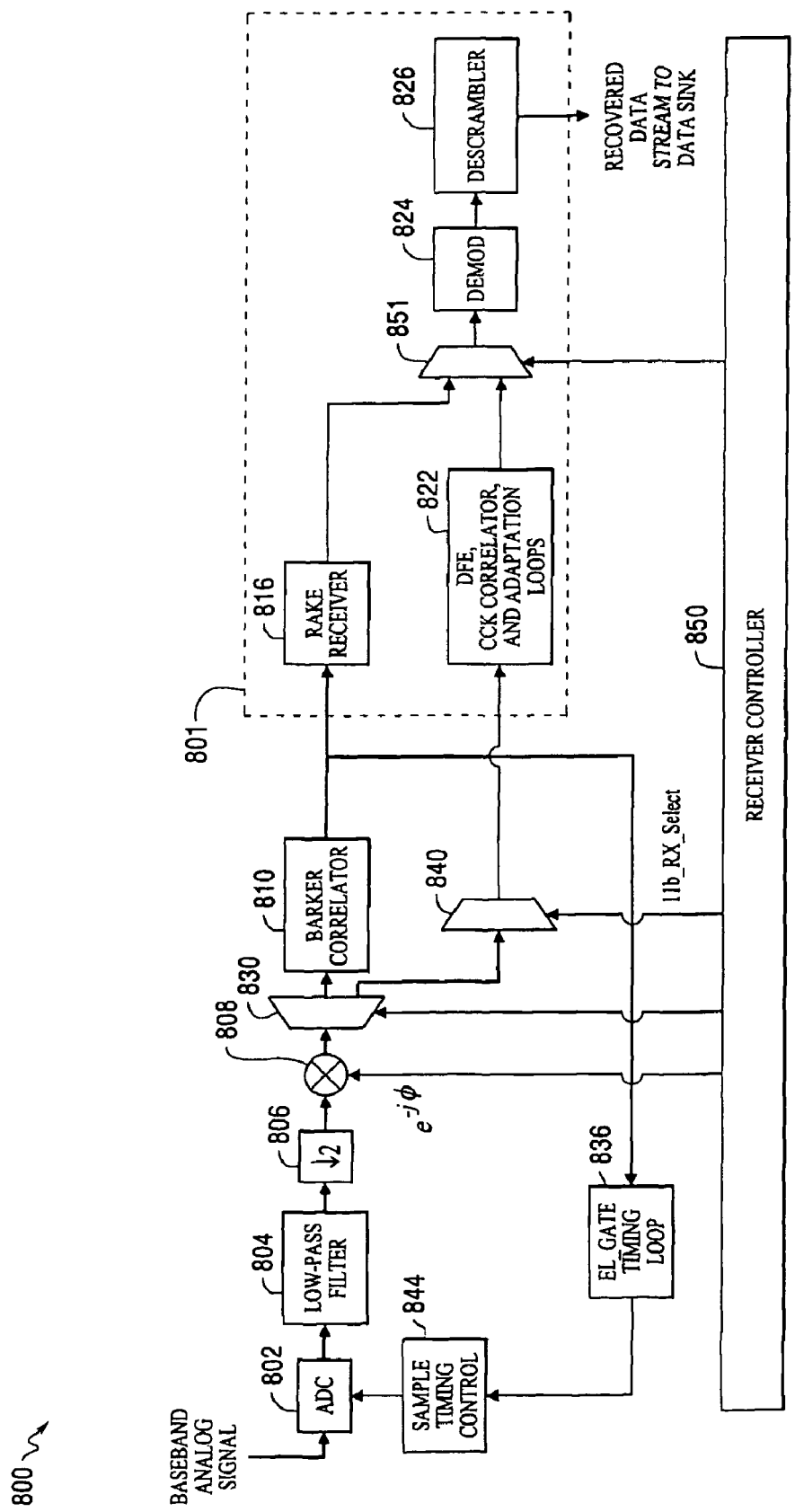
FIG. 8 is a schematic diagram of exemplary receiver device that may include the early-late gate based ADC timing circuit presented in FIG. 3.

FIG. 8 is a schematic diagram of exemplary receiver 800 that may include the early-late gate based ADC timing circuit 300 described above with respect to FIG. 3. Specifically, an exemplary embodiment of the early-late gate based ADC timing circuit 300, described with respect to FIG. 3 is represented in exemplary receiver 800 as an early-late timing loop 836 that may be selected by controller 850 of receiver 800 to generate phase control signals that may be used to phase lock analog-to-digital converter 802 to an incoming baseband analog signal to improve recovery of a data stream embedded within the baseband analog signal.

The exemplary receiver embodiment described below with respect to FIG. 8, may receive and process one or more baseband analog signals simultaneously. In FIG. 8, an exchange that may include one or more parallel signal/sample streams is indicated with a thick line between the respective modules shown in FIG. 8, whereas an exchange that is typically a single information signal between modules is indicated with a thin line.

As shown in FIG. 8, one or more baseband analog signals, each originating from a separate receiver, may be received and sampled by one or more analog-to-digital converters 802 at, for example, a 44 MHz sampling rate to produce one or more 44 MSPS sample streams. The one or more 44 MSPS sample streams may be received by one or more low-pass filters, e.g., one or more low-pass filters 804, to produce one or more 44 MSPS low-pass filtered sample streams that may be decimated by one or more digital decimators 806 to produce one or more 22 MSPS low-pass filtered sample streams. The one or more decimated sample streams may be phase-adjusted by one or more digital mixers 808 to produce one or more 22 MSPS complex baseband sample streams. The one or more 22 MSPS complex baseband sample streams may be processed by one or more Barker correlators 810 to produce one or more correlated complex baseband sample streams.

As further shown in FIG. 8, the one or more 22 MSPS complex baseband sample streams generated by one or more digital mixers 808 and the one or more 22 MSPS correlated complex baseband sample streams generated by one or more Barker correlators 810 may be provided as input to a plurality of modules included in receiver 800. For example, a dashed line 801 identifies a plurality of modules which may further process the one or more complex baseband sample streams to extract frequency and phase information related to the received baseband analog signal and to recover a data stream from the received baseband analog signal that may be delivered to one or more data sinks. A receiver controller 850 may monitor and coordinate operation of the respective modules.

For example, as indicated in FIG. 8, operation of modules within receiver device 800 may be monitored and controlled by receiver controller 850. For example, early-late gate timing loop 836 may be selected by receiver controller 850 to generate a phase adjustment control signal using, for example, the process described above with respect to FIG. 6 and FIG. 7. For example, receiver controller 850 may monitor the effectiveness of early-late timing loop 836 via, for example, a signal-to-noise ratio monitoring module, not shown, or a frame error rate monitoring module, also not shown. Status parameters monitored from within early-late timing loop 836 and/or status parameters monitored from within other monitored circuits/modules, may be used by receiver controller 850 to control operation of, for example, early-late gate based ADC timing circuit 300 and/or multi-receiver early-late difference generator 301, described above with respect to FIG. 3.

Further, as indicated in FIG. 8 by dashed line 801, receiver device 800 may include multiple processing paths for recovering a data stream embedded within a stream of complex baseband samples. For example, as shown in FIG. 8, in a first data processing path, one or more streams of correlated complex baseband samples at 22 MSPS output by one or more Barker correlators 810 may be processed by a RAKE receiver 816 to eliminate multipath conflicts and to produce a single stream of complex baseband samples at 1 MSPS that may be provided as a first input to multiplexor 851, which may be selectively controlled by controller 850. Controller 850 may selectively pass the single stream of complex baseband samples at 1 MSPS produced by the first data processing path to demodulator 824 which may produce a stream of demodulated samples at 1 MSPS that may be descrambled by descrambler 826 to produce a recovered data steam at 1 Mbps that may be delivered to one or more data sinks for processing.

In support of the above described first processing path, a frequency/phase detector, not shown, may monitor the output of, for example, RAKE receiver 816 and demodulator 824 to produce a frequency/phase estimate that may be used by receiver controller 850 to control the phase shift applied by the one or more digital mixers 808.

As further shown in FIG. 8, in a second data processing path, one or more streams of uncorrelated complex baseband samples at 22 MSPS may be selectively passed to an alternate processing path which may include a decision feedback equalizer, a complimentary code keying (CCK) correlator and related adaptation/support modules 822 to produce a single stream of complex baseband samples that may be selectively passed, in place of the data stream produced by the first data processing path, to demodulator 824 and descrambler 826 as the basis for generating the recovered data steam at 1 Mbps that may be delivered to one or more data sinks for processing.

As described above with respect to FIG. 8, receiver device 800 may include multiple processing paths for recovering a data stream from a downconverted IF signal. Exemplary embodiments of receiver device 800, may further include multiple processing paths for adjusting ADC sampling timing, not shown in FIG. 8, and may include a receiver controller 850 that may selectively choose and/or refine one or more of the available processing paths based on performance based monitoring. The early-late timing loop shown in FIG. 8 at block 836, exemplary embodiments of which are described above with respect to FIG. 3, may be one of many ADC sampling timing processing options, not shown in FIG. 8, available within receiver device 800 for selection by receiver controller 850 for use in performing sampling timing control of ADC 802.

Figure 9:
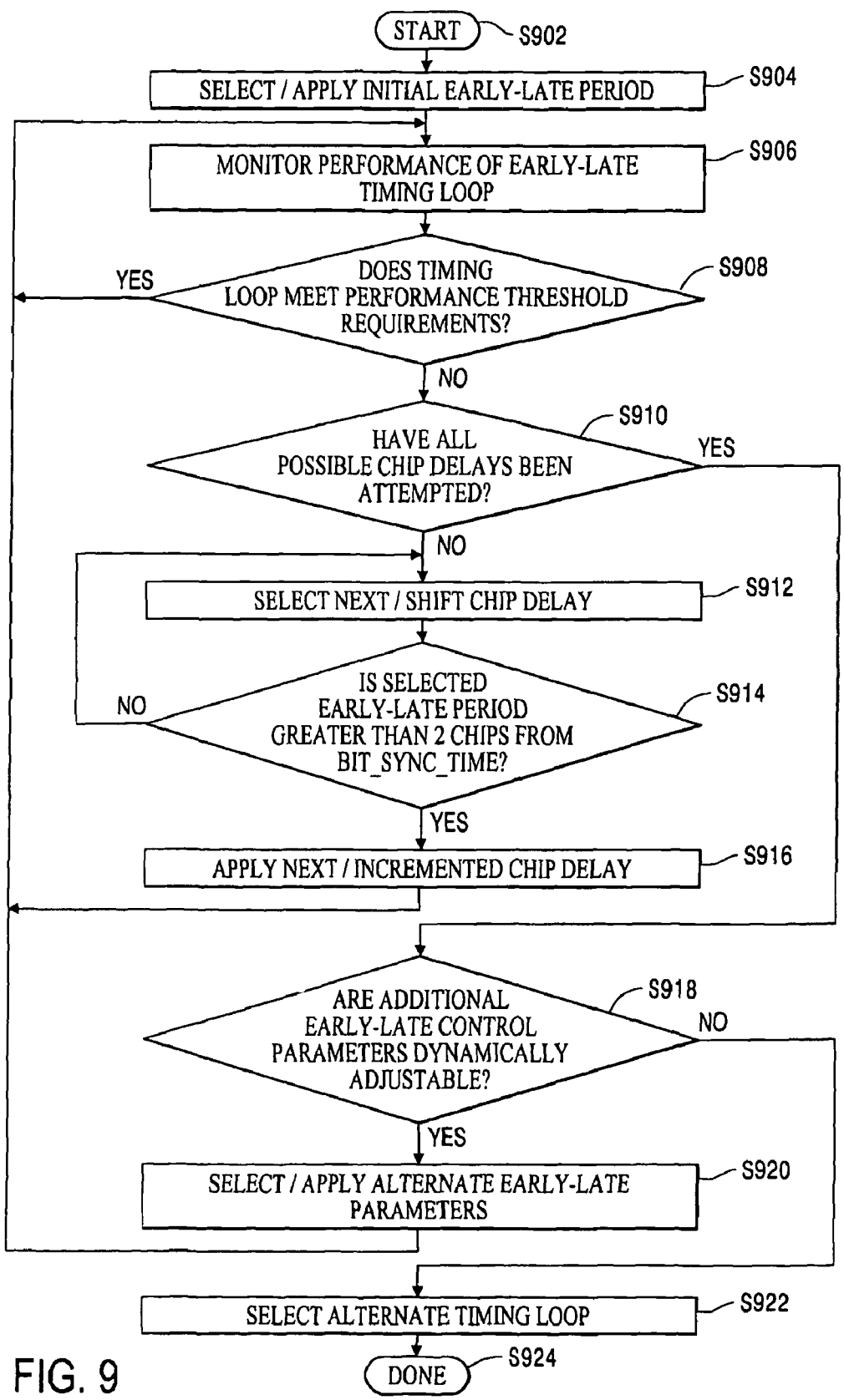
FIG. 9 is a flow diagram of an exemplary process executed by an exemplary receiver device controller which monitors and controls receiver device signal reception and processing.

FIG. 9 is a flow diagram of an exemplary process that may be executed by exemplary receiver device controller, e.g., as described above with respect to FIG. 8, to monitor and control operation of a receiver device, such as the exemplary receiver device described above with respect to FIG. 8. The process flow presented in FIG. 9 assumes that the early-late gate based ADC timing circuit included in the receiver, e.g., as shown in FIG. 8 at block 836, includes a dynamically configurable chip_delay parameter, as described above with respect to FIG. 3, block 320, and that other parameters, such as the bit_sync_time indicator, bit_sync, may also be dynamically configurable. Please note that in some exemplary embodiments, one or more parameters such as the chip_delay parameter may be fixed.

As shown in FIG. 9, operation of the process may begin at step S902 with startup of an exemplary early-late gate based ADC timing circuit, for example, as described above with respect to FIG. 3, by a receiver device, as described above with respect to FIG. 8. As described above, such a receiver device may include numerous circuits that support numerous functions that facilitate RF signal reception and the extraction of an embedded data stream under a wide range of processing states and distortion conditions.

For example, as described above with respect to FIG. 8, such a receiver device may include a plurality of timing loop functions, e.g., such as a zero-crossing timing loop, an early-late timing loop, a zero-forcing timing loop, and/or a carrier recovery loop. In addition, the receiver device may include a plurality of signal processing functions such as a bitsync generator, RAKE processor, decision feedback equalizer (DFE), phase detector, demodulator, descramblers, signal-to-noise ratio monitors, frame error rate monitors, etc. Therefore, based on the prior, and/or consecutive operation of such functions, and/or prior execution of the early-late timing loop itself, the receiver device controller may have knowledge that may be used to initiate/refine operation of a new early-late process.

As shown in FIG. 9, on startup of an early-late process, at step S902, the receiver device controller may apply, at step S904, an initial set of control parameters that may include a selected early-late processing period, and processing may proceed to step S906.

For example, in step S904, the applied early-late processing period may be determined by the chip_delay provided to early-late gate controller 303, as described above with respect to FIG. 3 and block 320. Such a chip_delay may set a late-time relative to the current bit_sync_time, thereby inherently setting the early-time, due to a fixed or dynamically controlled separation. For example, the separation time between the early-time and the late-time in the exemplary embodiment described above with respect to FIG. 3, is determined by first delay register 308a and second delay register 308b which, arranged in series, result in a 1-chip separation. However, such a separation time could be dynamically configurable, assuming the delay applied by one or more of first delay register 308a and second delay register 308b were dynamically configurable.

In step S906, receiver device controller may monitor performance of the early-late timing loop, e.g., using a frame-error-ratio and/or signal-to-noise ratio monitoring function, and processing proceeds to step S908.

If, in step S908, the receiver device controller determines that the early-late timing loop is not meeting one or more performance thresholds, e.g., a frame-error-ratio maximum threshold is exceeded and/or signal-to-noise ratio minimum threshold is exceeded, processing proceeds to step S910, otherwise, processing returns to step S906.

If, in step S910, the receiver device controller determines that all possible chip delays, i.e., early-late periods, have been attempted, processing proceeds to step S918, otherwise, processing proceeds to step S912.

In step S912, the receiver device controller may select a next chip delay. For example, a next chip delay may be based on a ½-chip increment, or a ½-chip decrement of the previous shift delay. Alternatively, the next chip delay may be based on a scanning algorithm configured to rapidly home-in on an early-late period that is sufficiently stable to support early-late processing. Once a next chip delay is selected, processing may proceed to step S914.

If, in step S914, the receiver device controller determines that the selected next chip delay results in an early-late period that is sufficiently separated from a determined bit_sync_time, i.e., the separation is greater than a predetermined number of ½-chip increments, processing proceeds to step S916, otherwise, processing returns to step S912.

In step S914, described above, the required separation between the bit_sync_time and a selected early-late period may be static or dynamic. In one embodiment, the separation may be required to be at least 5-chips from the currently determined bit_sync_time. In other embodiments the separation may range from 5-chips down to a single chip. In yet other embodiments, the separation between a selected early-late period may be dynamically configured in response to monitored early-late timing loop performance parameters. Using one or more of the above techniques, the early-late timing loop may be optimized for fixed multipath distortion environments, and/or multipath environments in which the multipath distortion is dynamically changing.

In step S916, the selected next chip delay maybe implemented, for example, by passing a new chip_delay value to static/dynamic chip delay 320, as described above with respect to FIG. 3, and processing returns to step S906 and the above process may be repeated.

As described above, if the receiver device controller determines, in step S910, that all possible chip delays, i.e., early-late periods, have been attempted, processing proceeds to step S918.

If, in step S918, the receiver device controller determines that all possible dynamically configurable early-late timing loop control parameters configurations have not been exhausted, processing proceeds to step S920 and the receiver device controller may proceed to incrementally adjust the respective other dynamically configurable control parameters based on, for example, feedback from early-late timing monitoring functions until such alternatives are exhausted or an acceptable level of early-late timing loop performance is achieved.

However, if, in step S918, the receiver device controller determines that all possible dynamically configurable early-late timing loop control parameters configurations have been exhausted, processing proceeds to step S922 and an alternate timing loop, i.e., a timing loop other than the early-late timing loop may be selected, and the early-late timing loop process is terminated.

Figure 10:
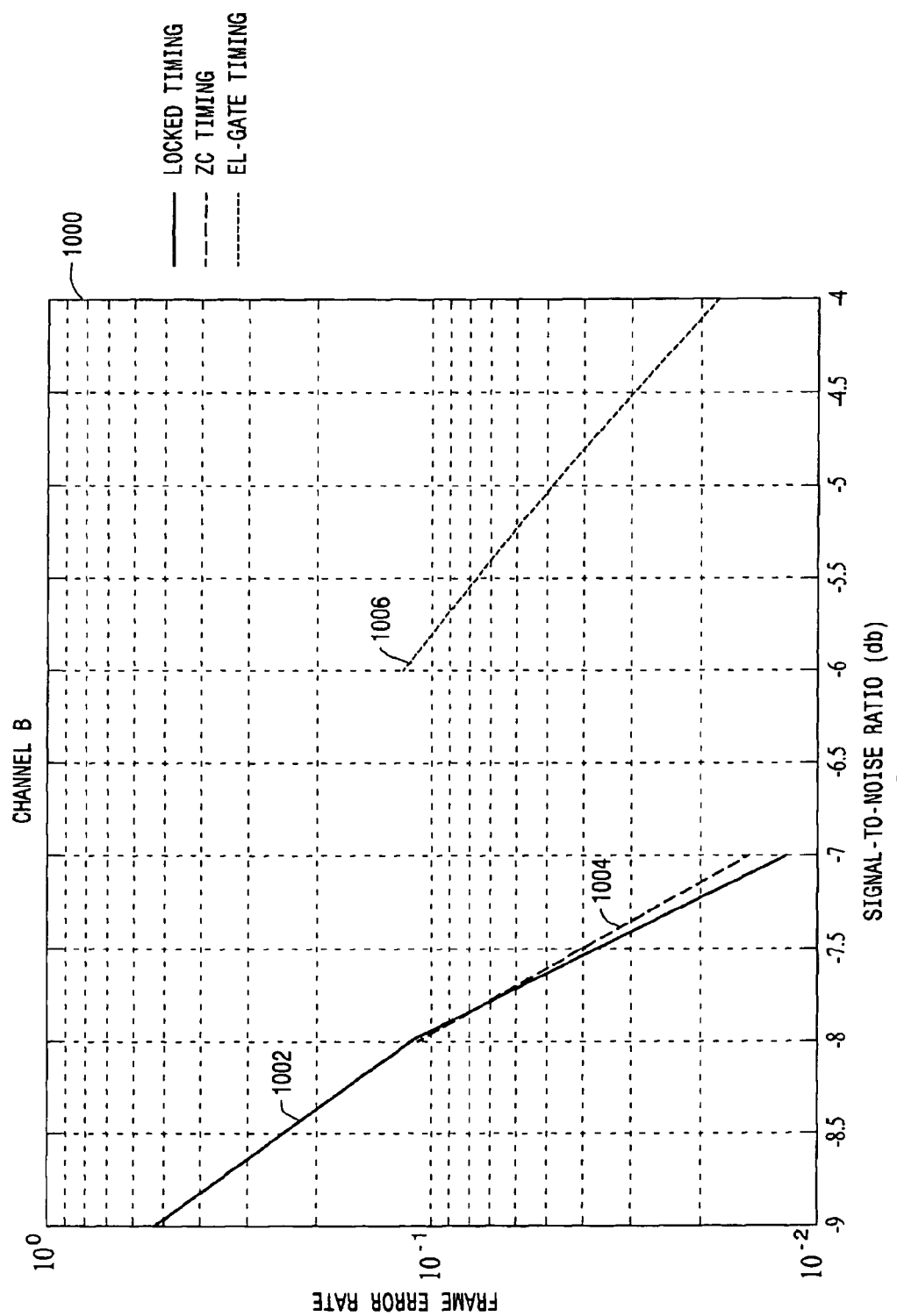
FIG. 10, FIG. 11 and FIG. 12 are plots of frame error rate versus signal-to-noise ratios for a first, second and third transmission channel, respectively, based on a simulation of the receiver device presented in FIG. 8 in which two different timing loops, i.e., a zero-crossing timing loop, and the early-late timing loop described above with respect to FIG. 3, are compared against a simulated, fully locked timing loop.
Figure 11:
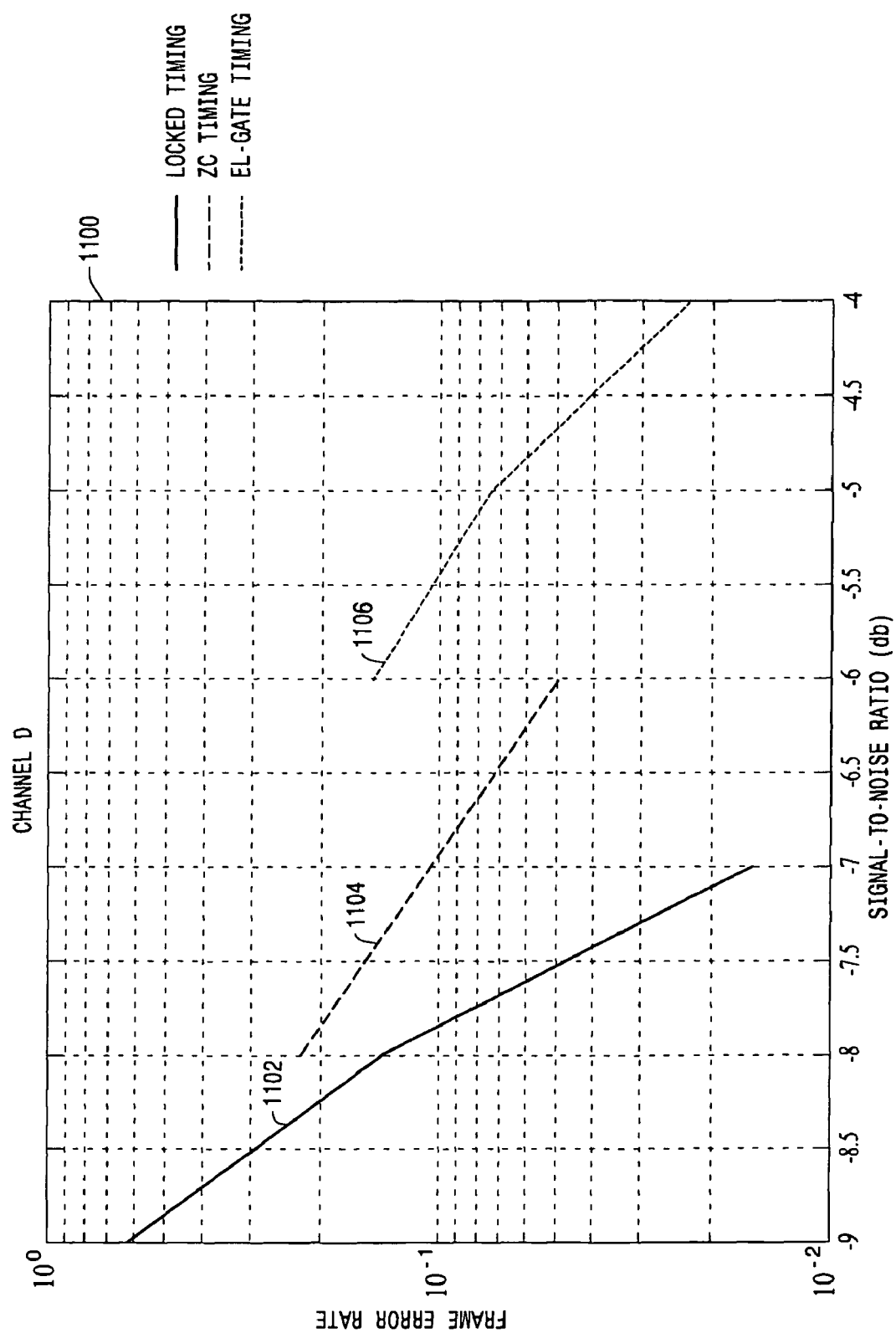
Figure 12:
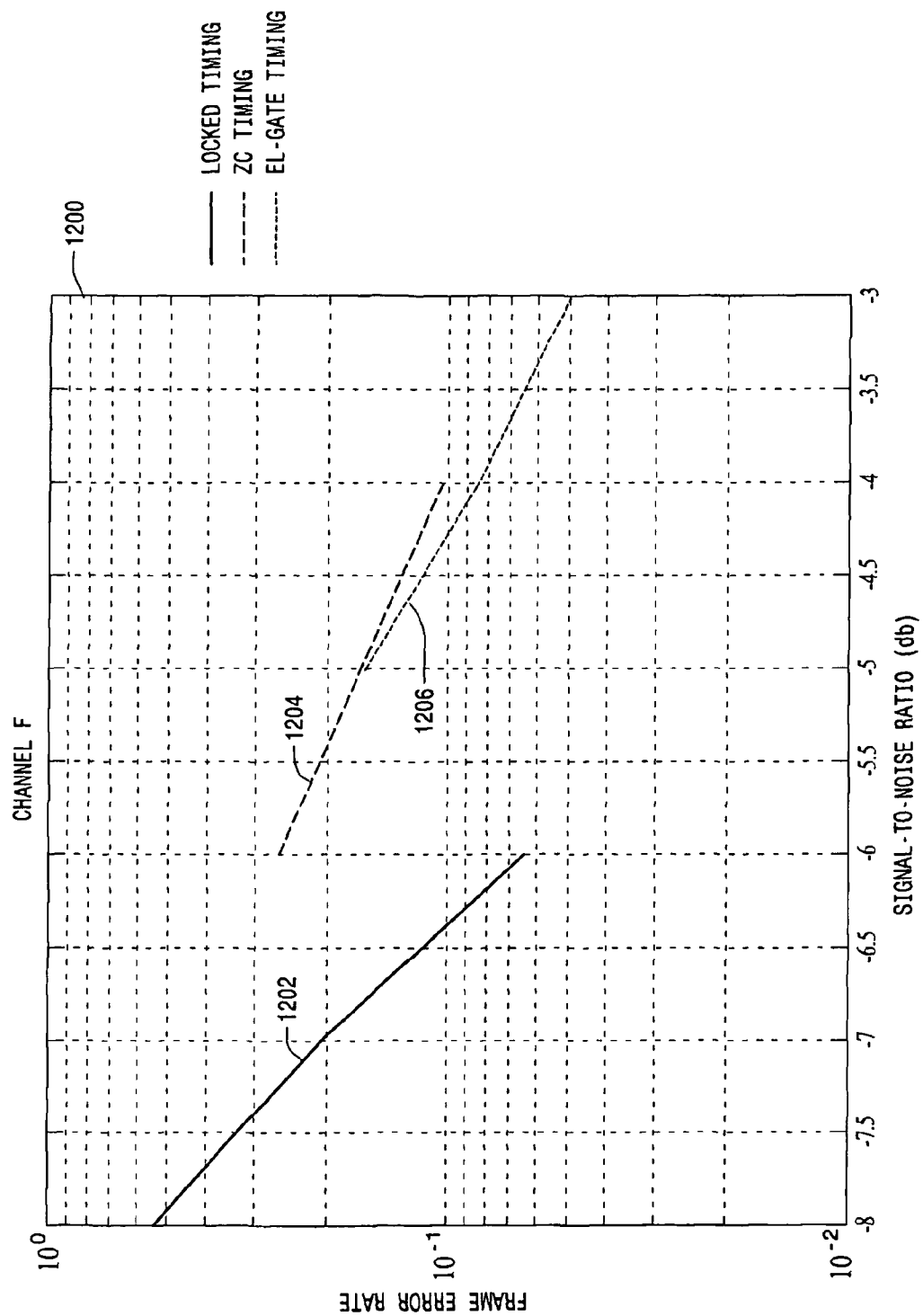

FIG. 10, FIG. 11 and FIG. 12 are plots of frame error rates versus signal-to-noise ratios for a first, second and third transmission channel, respectively. For each transmission channel, a first plot represents a plot of frame error rates versus signal-to-noise ratios for the channel assuming that the receiver has achieved perfectly locked ADC sampling timing; a second plot represents a plot of frame error rates versus signal-to-noise ratios for the channel assuming that the receiver is using a zero-crossing based timing loop to control ADC sampling timing; and a third plot represents a plot of frame error rates versus signal-to-noise ratios for the channel assuming that the receiver is using the early-late based timing loop as described above with respect to FIGS. 3-9. In each of FIG. 10, FIG. 11 and FIG. 12, the plot representing frame error rates versus signal-to-noise ratios for a perfectly locked ADC sampling timing is the optimal solution, however, such a solution cannot always be achieved. In each of FIG. 10, FIG. 11 and FIG. 12, the plot representing frame error rates versus signal-to-noise ratios for receiver using a zero-crossing based timing loop to control ADC sampling timing appears to perform better that the proposed early-late based timing loop, however, such a zero-crossing based timing loop may be more complex to implement. Further, as expected, the proposed early-late based timing loop demonstrates strong performance in heavy multi-path conditions.

In each of FIG. 10, FIG. 11 and FIG. 12, the plot representing the early-late based timing loop is based on a model that uses a static chip delay of 7-chips from a determined bit_sync_time. As a result, the early-late period for which the phase adjustment control signal was generated had an early-time at 5-chips before each subsequent bit_sync_time and a late-time 1-chip thereafter, at 4-chips before the bit_sync_time, as described above with respect to FIG. 5.

FIG. 10 presents of a plot 1000 that shows frame error rates versus signal-to-noise ratios for a first channel, Channel-B, that is not affected by multipath distortion, but merely by additive white Gaussian noise. As shown in FIG. 10 at plot 1004, the receiver device using a zero-crossing timing loop achieves a similar frame error rate at a given signal-to-noise ratio, when compared with that achieved by a perfectly locked receiver, as shown in FIG. 10 at plot 1002. In comparison, the receiver device using an early-late timing loop as described above with respect to FIG. 3, with a static 7-chip delay, as described above with respect to FIG. 5, achieves a frame error rate comparable to the zero-crossing timing loop at a signal-to-noise ratio that is approximately 2 dB higher than that achieved by the zero-crossing timing loop.

FIG. 11 presents of a plot 1100 that shows frame error rates versus signal-to-noise ratios for a second channel, Channel-D, that is slightly affected by multipath distortion and AWGN. As shown in FIG. 11 at plot 1104, the receiver device using a zero-crossing timing loop requires higher signal-to-noise ratio for a given frame error rate, when compared that achieved by a perfectly locked receiver, as shown in FIG. 11 at plot 1102. In comparison, the receiver device using an early-late timing loop as described above with respect to FIG. 3, with a static 7-chip delay, as described above with respect to FIG. 5, may requires approximately 1.5 dB higher signal to noise ratio than the zero-crossing timing loop for a given frame error rate.

FIG. 12 presents a plot 1200 that shows frame error rates versus signal-to-noise ratios for a third channel, Channel-F, that is significantly affected by multipath distortion and AWGN. As shown in FIG. 12 at plot 1204, the receiver device using a zero-crossing timing loop requires a higher signal-to-noise ratio for a given frame error rate, when compared that achieved by a perfectly locked receiver, as shown in FIG. 12 at plot 1202. In comparison, the receiver device using an early-late timing loop as described above with respect to FIG. 3, with a static 7-chip delay, as described above with respect to FIG. 5, may achieve a frame error rate that is slightly lower than that achieved by the zero-crossing timing loop, and may provide an improved signal-to-noise response, as demonstrated in FIG. 12 at −5 dB SNR through at least −4 dB SNR over that achieved by the zero-crossing timing loop.

Therefore, it has been demonstrated that an early-late timing loop, as described above, may outperform a zero-crossing timing loop under some multipath conditions, and therefore remains a viable alternative for use in performing ADC sampling phase adjustments in environments afflicted by multipath distortion.

For purposes of explanation, in the above description, numerous specific details are set forth in order to provide a thorough understanding of the described early-late gate timing recovery approach for use with single or multi-antenna receivers. It will be apparent, however, to one skilled in the art that the described early-late gate timing recovery approach may be practiced without these specific details. In other instances, well-known structures and devices are shown in block diagram form in order to avoid obscuring the features of the described early-late gate timing recovery approach.

While the described early-late gate timing recovery approach has been described in conjunction with the specific embodiments thereof, it is evident that many alternatives, modifications, and variations will be apparent to those skilled in the art. Accordingly, embodiments of the described early-late gate timing recovery approach as set forth herein are intended to be illustrative, not limiting. There are changes that may be made without departing from the spirit and scope of the invention.

For example, it is to be understood that various functions that support the described early-late gate timing recovery approach may be distributed in any manner among any quantity (e.g., one or more) of hardware and/or software modules or units that may be interconnected with circuitry and/or software interfaces.

The various functions that support embodiments of the described early-late gate timing recovery approach may be integrated within virtually any portable and/or stationary device including, but not limited to, cell phones, personal digital assistants, laptop computers, workstation computers, printers, scanners, network routers and/or other access points to local and/or wide area networks, cameras, child tracking/monitoring devices etc. Further, the described stations may also be integrated within devices such as household/office/factory equipment including, but not limited to, refrigerators, heating and cooling systems, lock mechanisms, fire alarms and/or other security/safety monitoring devices, lighting systems, environmental monitoring systems, etc. The functions that support the described early-late gate timing recovery approach may be integrated within any device from which a user benefit may be derived by passing information to and/or receiving information from the device.

The functions that support the described early-late gate timing recovery approach may include any commercially available operating system (e.g., Windows, OS/2, Unix, Linux, DOS, etc.), any commercially available and/or custom software (e.g., communication software, etc.) and any types of input/output devices (e.g., keyboard, mouse, probes, I/O port, etc.).

Software, or firmware, that support the described early-late gate timing recovery approach may be implemented in any desired computer language, and may be developed by one of ordinary skill in the computer and/or programming arts based on the functional description contained herein and illustrated in the drawings. For example, in one exemplary embodiment the described system may be written using the C++ programming language or the JAVA programming language. However, the present invention is not limited to being implemented in any specific programming language or combination of programming languages.

Any software associated with the described early-late gate timing recovery approach may be distributed via any suitable media (e.g., removable memory cards, CD-ROM, tape or other storage media diskette, ad-hoc network connection). Software and/or default control parameters may be installed in any manner (e.g., an install program, copying files, entering an execute command, etc.).

The described early-late gate timing recovery approach may accommodate any quantity and any type of data sets in any desired format (e.g., ASCII, plain text, or other format, etc.). The format and structure of internal information structures used to hold intermediate information in support of the described early-late gate timing recovery approach may include, but are not limited to files, arrays, matrices, status and control booleans/variables.

Further, any references herein to software performing various functions generally refer to computer systems or processors performing those functions under software control. The computer system may alternatively be implemented by hardware or other processing circuitry. The various functions of the described stations that support embodiments of the described early-late gate timing recovery approach may be distributed in any manner among any quantity (e.g., one or more) of hardware and/or software modules or units, computers or processing systems or circuitry.

From the foregoing description, it will be appreciated that a receiver device that supports embodiments of the described early-late gate timing recovery approach is disclosed. The described approach is compatible and may be seamlessly integrated within 802.11 compliant hardware devices.

While a method and apparatus are disclosed that provide a receiver device that supports the described early-late gate timing recovery approach, various modifications, variations and changes are possible within the skill of one of ordinary skill in the art, and fall within the scope of the present invention. Although specific terms are employed herein, they are used in their ordinary and accustomed manner only, unless expressly defined differently herein, and not for purposes of limitation.

What is claimed is:

1. A method of generating a sampling timing correction for an analog-to-digital converter, the method comprising:
   receiving a correlated complex baseband sample from each of one or more correlators for a current tap;
   generating a magnitude for each received correlated complex baseband sample for the current tap;
   generating by an adder a combined magnitude based on the generated magnitudes;
   retrieving and storing by a register the combined magnitude generated for the current tap;
   generating a combined magnitude difference based on the combined magnitude generated at the current tap and a combined magnitude generated at a prior tap; and
   generating a sampling timing correction based on the generated combined magnitude difference.

2. The method of claim 1, wherein the correlated baseband sample is a Barker code correlated baseband sample.

3. The method of claim 1, wherein each baseband sample originates from a separate receiver.

4. The method of claim 1, wherein the magnitude is generated based on a relationship, $$\text{magnitude}(x) = \max((Re\{x\}), (Im\{x\})) \times 13/32(\min((Re\{x\}), (Im\{x\})));$$

wherein $Re\{x\}$ is an In-phase portion of the correlated complex baseband sample;
wherein $Im\{x\}$ is a Quadrature portion of the correlated complex baseband sample;
wherein the function max( ) returns a larger of the In-phase portion and the Quadrature portion; and
wherein the function min( ) returns a smaller of the In-phase portion and the Quadrature portion.

5. The method of claim 1, wherein the current tap and the prior tap are separated from a bit synchronization time by at least two chips.

6. The method of claim 5, wherein the current tap and the prior tap are separated from a predetermined bit synchronization time by a dynamically configurable separation that is two or more chips prior to, or subsequent to, the bit synchronization time.

7. The method of claim 5, wherein the current tap and the prior tap are separated by at least one chip.

8. The method of claim 5, further comprising:
   monitoring a performance parameter associated with recovery of a data stream encoded within a plurality of received complex baseband samples and adjusting a chip delay that controls the separation of the current tap and the prior tap from the bit synchronization time based on the monitored performance parameter.

9. The method of claim 8, wherein the performance parameter is based on one of a signal-to-noise ratio and a frame error rate.

10. The method of claim 1, wherein generating a sampling timing correction based on the generated combined magnitude difference includes:
    processing the combined magnitude difference via a proportional path and an integrating path and summing an output of the respective paths.

11. A timing control apparatus for generating a sampling timing correction for an analog-to-digital converter, the apparatus comprising:
    a early-late difference generator that receives a correlated complex baseband sample from each of one or more correlators for a current tap, the early-late difference generator comprising:
      one or more magnitude calculators that generate a magnitude for each received correlated complex baseband sample for the current tap;
      a first adder that generates a combined magnitude based on magnitudes;
      a first chip delay register that receives and stores the combined magnitude generated for the current tap; and
      a second adder that retrieves from the first chip delay register a combined magnitude generated at a prior tap and generates a combined magnitude difference based on the combined magnitude generated at the current tap and the combined magnitude generated at the prior tap; and
    a timing filter that generates a sampling timing correction based on the generated combined magnitude difference.

12. The timing control apparatus of claim 11, wherein each of the one or more magnitude calculators comprises:
    a first splitter that extracts an In-Phase component from the received correlated complex sample; and
    a second splitter that extracts a Quadrature component from the received correlated complex sample.

13. The timing control apparatus of claim 11, wherein each baseband sample originates from a separate receiver.

14. The timing control apparatus of claim 12, wherein the one or more magnitude calculators further comprise:
    a maximum/minimum comparator that identifies a larger and a smaller of the In-Phase component and the Quadrature component.

15. The timing control apparatus of claim 11, further comprising:
an early-late gate controller that includes a second chip delay register that is configured to separate the current tap and the prior tap from a bit synchronization time by at least two chips.

16. The timing control apparatus of claim 15, wherein the second chip delay register further comprises:
a configurable delay controller that allows a chip separation between the current tap and the prior tap from the bit synchronization time to be dynamically configurable.

17. The timing control apparatus of claim 15, the first delay register further comprising:
a delay controller that separates the current tap and the prior tap by at least one chip.

18. The timing control apparatus of claim 15, further comprising:
a controller that monitors a performance parameter associated with recovery of a data stream encoded within a plurality of received complex baseband samples and that adjusts a chip delay that controls the separation of the current tap and the prior tap from the bit synchronization time based on the monitored performance parameter.

19. The timing control apparatus of claim 18, wherein the controller further comprises:
one of a signal-to-noise ratio monitor and a frame error rate monitor.

20. The timing control apparatus of claim 11, wherein the timing filter that generates a sampling timing correction based on the generated combined magnitude difference further comprises:
a proportional-integral loop that includes a proportional path and an integrating path; and
an adder that sums output of the respective paths.

21. A receiver device comprising:
a controller that monitors a performance of a plurality of timing loops and controls which of the plurality of timing loops is used to adjust a sampling timing of an analog-to-digital converter based on the monitored performance;
wherein one of the plurality of timing loops is an early-late timing loop comprising:
an early-late difference generator that receives a correlated complex baseband sample from each of one or more correlators for a $tap_N$, the early-late difference generator comprising:
one or more magnitude calculators that generate a magnitude for each received correlated complex baseband sample;
a first adder that generates a combined magnitude based on a plurality of magnitudes generated for $tap_N$;
a first chip delay register that receives and stores the combined magnitude generated for $tap_N$; and
a second adder that retrieves from the first chip delay register a combined magnitude generated at a prior tap, $tap_{N-2}$, and generates a combined magnitude difference based on the combined magnitude generated at $tap_N$ and the combined magnitude generated at $tap_{N-2}$; and
a timing filter that generates a sampling timing correction based on the generated combined magnitude difference.

22. The receiver device of claim 21, wherein each of the one or more magnitude calculators comprises:
a first splitter that extracts an In-Phase component from the received correlated complex sample; and
a second splitter that extracts a Quadrature component from the received correlated complex sample.

23. The receiver device of claim 21, wherein each baseband sample originates from a separate receiver.

24. The receiver device of claim 22, wherein the one or more magnitude calculators further comprise:
a maximum/minimum comparator that identifies a larger and a smaller of the In-Phase component and the Quadrature component.

25. The receiver device of claim 21, further comprising:
an early-late gate controller that includes a second chip delay register that is configured to separate $tap_N$ and $tap_{N-2}$ from a bit synchronization time by at least two chips.

26. The receiver device of claim 25, wherein the second chip delay register further comprises:
a configurable delay controller that allows the controller to dynamically configure a chip separation separating $tap_N$ and $tap_{N-2}$ from the bit synchronization time.

27. The receiver device of claim 25, the first delay register further comprising:
a delay controller that separates $tap_N$ and $tap_{N-2}$ by at least one chip.

28. The receiver device of claim 25, wherein the controller monitors a performance parameter associated with recovery of a data stream encoded within a plurality of received complex baseband samples and that adjusts a chip delay that controls the separation of $tap_N$ and $tap_{N-2}$ from the bit synchronization time based on the monitored performance parameter.

29. The receiver device of claim 28, wherein the controller further comprises:
one of a signal-to-noise ratio monitor and a frame error rate monitor.

30. The receiver device of claim 21, wherein the timing filter that generates a sampling timing correction based on the generated combined magnitude difference further comprises:
a proportional-integral loop that includes a proportional path and an integrating path; and
an adder that sums output of the respective paths.

* * * * *